(12) United States Patent
Yukawa et al.

(10) Patent No.: US 10,411,609 B2
(45) Date of Patent: Sep. 10, 2019

(54) SUBSTRATE MOUNTED INVERTER DEVICE

(71) Applicant: Panasonic Intellectual Property Management Co., Ltd., Osaka (JP)

(72) Inventors: Junichi Yukawa, Kanagawa (JP); Yoshihiko Maeda, Osaka (JP); Satoshi Okawa, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/207,245

(22) Filed: Dec. 3, 2018

(65) Prior Publication Data

US 2019/0199224 A1    Jun. 27, 2019

(30) Foreign Application Priority Data

Dec. 22, 2017 (JP) ................................ 2017-246777
Jul. 9, 2018 (JP) ................................ 2018-130048

(51) Int. Cl.
| | | |
|---|---|---|
| *H02M 7/00* | (2006.01) | |
| *H02M 3/335* | (2006.01) | |
| *H03K 17/687* | (2006.01) | |
| *H03K 17/0412* | (2006.01) | |
| *H02M 3/156* | (2006.01) | |

(52) U.S. Cl.
CPC ....... *H02M 3/33569* (2013.01); *H02M 3/156* (2013.01); *H02M 7/003* (2013.01); *H03K 17/04123* (2013.01); *H03K 17/687* (2013.01)

(58) Field of Classification Search
CPC ........ H02M 7/003; H01L 27/00; H01L 27/12; H03K 17/687; H03K 17/04123

USPC ......... 363/137, 141, 146, 147; 361/715–721, 361/728–730, 736

See application file for complete search history.

(56) References Cited

U.S. PATENT DOCUMENTS

| | | | | |
|---|---|---|---|---|
| 5,077,595 | A * | 12/1991 | Fukunaga | ............. H01L 23/142 |
| | | | | 257/659 |
| 6,166,937 | A * | 12/2000 | Yamamura | ............ H01L 23/473 |
| | | | | 257/E23.098 |
| 10,137,789 | B2 * | 11/2018 | Xu | ........................ H02M 7/003 |
| 2014/0159225 | A1 * | 6/2014 | Zushi | ................. H01L 23/3735 |
| | | | | 257/690 |
| 2015/0077942 | A1 * | 3/2015 | Roche | ................. H01L 23/3735 |
| | | | | 361/708 |
| 2016/0007500 | A1 * | 1/2016 | Koguma | ................. H01L 25/07 |
| | | | | 363/141 |
| 2016/0352246 | A1 * | 12/2016 | Lai | ........................ H02M 7/003 |
| 2017/0372980 | A1 * | 12/2017 | Kurahashi | ............ H05K 3/4697 |
| 2018/0076728 | A1 * | 3/2018 | Hong | .................... H05K 1/0265 |

(Continued)

FOREIGN PATENT DOCUMENTS

JP    2001-286156    10/2001

*Primary Examiner* — Alex Torres-Rivera
(74) *Attorney, Agent, or Firm* — Greenblum & Bernstein, P.L.C.

(57) ABSTRACT

The present disclosure reduces heat concentration on switching elements. A plurality of high-side transistors are connected in parallel to constitute high-side switching element. A plurality of low-side transistors are connected in parallel to constitute low-side switching element. The plurality of high-side transistors are arranged, one by one, next to the plurality of low-side transistors.

9 Claims, 14 Drawing Sheets

(56) References Cited

U.S. PATENT DOCUMENTS

2018/0102306 A1* 4/2018 Cho .................. H01L 23/4951
2018/0241319 A1* 8/2018 Bando .................. H02M 7/48

* cited by examiner

SUBSTRATE MOUNTED INVERTER DEVICE

TECHNICAL FIELD

The present disclosure relates to switching power supply devices.

BACKGROUND ART

Heretofore, switching power supply devices are known. For example, PTL 1 discloses a substrate-mounted inverter device in which a semiconductor chip is mounted on a surface of a metal substrate with a ceramic-based substrate therebetween (the semiconductor chip includes switching elements and diodes that constitute an inverter). In this device, the three-phase inverter has an upper arm and a lower arm; the upper arm includes a switching element (high-side switching element), and the lower arm includes a switching element (low-side switching element). A collector of the high-side switching element is mounted on an upper-arm-side wiring pattern, and an emitter of the low-side switching element is mounted on a lower-arm-side wiring pattern. The emitter of the high-side switching element is electrically connected to the collector of the low-side switching element via a beam lead electrode for connecting the upper and lower arms.

CITATION LIST

Patent Literature

PTL 1: Unexamined Japanese Patent Publication No. 2001-286156

SUMMARY OF THE INVENTION

Technical Problem

In a switching power supply device as disclosed in PTL 1, a high-side switching element and a low-side switching element are each expected to include a plurality of transistors. If the plurality of transistors (high-side transistors) that constitute the high-side switching element are disposed densely and the plurality of transistors (low-side transistors) that constitute the low-side switching element are also disposed densely, heat may be concentrated on the high-side switching element or low-side switching element. For example, during a period in which the high-side switching element is in an ON state and the low-side switching element is in an OFF state, the plurality of high-side transistors are heated. As a result, heat may be concentrated on the collection of the plurality of high-side transistors (namely, high-side switching element). During a period in which the high-side switching element is in an OFF state and the low-side switching element is in an ON state, the plurality of low-side transistors are heated. As a result, heat may be concentrated on the collection of the plurality of low-side transistors (namely, low-side switching element).

Solution to Problem

A switching power supply device according to an aspect of the present disclosure includes: a high-side switching element; a low-side switching element connected in series to the high-side switching element; a substrate that has an insulating layer and a conductive layer, the conductive layer being provided on one surface of the insulating layer; a plurality of high-side transistors provided in the conductive layer, the high-side transistors being connected in parallel to constitute the high-side switching element; and a plurality of low-side transistors provided in the conductive layer, the low-side transistors being connected in parallel to constitute the low-side switching element. The plurality of high-side transistors are arranged, one by one, next to the plurality of low-side transistors.

A switching power supply device according to another aspect of the present disclosure includes: a high-side switching element; a low-side switching element connected in series to the high-side switching element; a substrate that has an insulating layer and a conductive layer, the conductive layer being provided on one surface of the insulating layer; high-side transistors provided in the conductive layer, the high-side transistors being connected in parallel to constitute the high-side switching element; low-side transistors provided in the conductive layer, the low-side transistors being connected in parallel to constitute the low-side switching element; and a smoothing capacitor section provided in the conductive layer. The smoothing capacitor section has a plurality of capacitors provided in the conductive layer, the capacitors corresponding to the high-side transistors and the low-side transistors. The high-side transistors, the low-side transistors, and the plurality of capacitors are disposed such that pairs each including the high-side transistor and a corresponding capacitor are positioned next to pairs each including the low-side transistor and a corresponding capacitor.

Advantageous Effect of Invention

According to the present disclosure, it is possible to reduce heat concentration on a high-side switching element and a low-side switching element.

DESCRIPTION OF EMBODIMENTS

Exemplary embodiments will be described below in detail with reference to the accompanying drawings. It should be noted that identical or equivalent parts are given identical reference signs, and the description of such parts will not be repeated.

First Exemplary Embodiment

Figure 1:
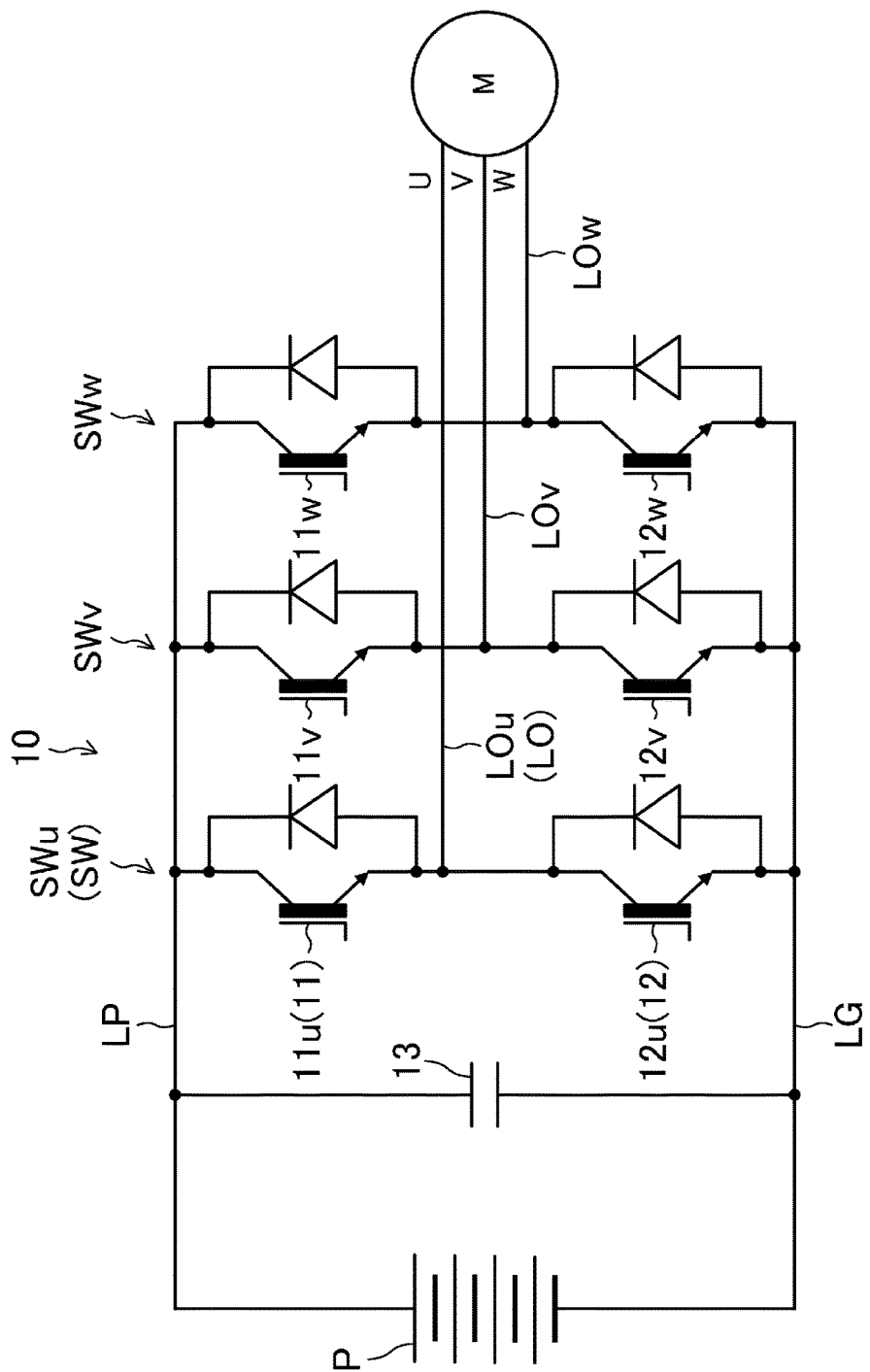
FIG. 1 is a circuit diagram illustrating a configuration of a switching power supply device according to a first exemplary embodiment.

FIG. 1 illustrates a configuration of switching power supply device 10 according to an exemplary embodiment. Switching power supply device 10 performs a switching operation to convert electric power supplied from a power supply (direct current (DC) power supply P in this example) into output electric power and then supplies this output electric power to a target to be driven (motor M in this example). In this example, motor M may be a three-phase alternating current (AC) motor, and switching power supply device 10 may serve as an inverter that converts DC power into three-phase AC power.

Switching power supply device 10 includes power supply wire LP, ground wire LG, one or more output lines LO, one or more switching sections SW, and smoothing capacitor section 13. Smoothing capacitor section 13 is connected between power supply wire LP and ground wire LG. Each of switching sections SW has high-side switching element 11 and low-side switching element 12 that are connected in series between power supply wire LP and ground wire LG. An intermediate point of each switching section SW (namely, a node between high-side switching element 11 and low-side switching element 12) is connected to the target to be driven (motor M in this example) via corresponding output line LO. In the figure, a circulating diode is connected in parallel to each of high-side switching elements 11 and low-side switching elements 12. These circulating diodes correspond to parasitic diodes parasitized in high-side switching elements 11 and low-side switching elements 12.

In this example, switching power supply device 10 is provided with three output lines (first output line LOu, second output line LOv, third output line LOw) and three switching sections (first switching section SWu, second switching section SWv, third switching section SWw). One end (positive electrode) of DC power supply P is connected to power supply wire LP, whereas the other end (negative electrode) of DC power supply P is connected to ground wire LG.

First switching section SWu has first high-side switching element 11u and first low-side switching element 12u. A node between first high-side switching element 11u and first low-side switching element 12u is connected to a U-phase coil (not illustrated) of motor M via first output line LOu.

Second switching section SWv has second high-side switching element 11v and second low-side switching element 12v. A node between second high-side switching element 11v and second low-side switching element 12v is connected to a V-phase coil (not illustrated) of motor M via second output line LOv.

Third switching section SWw has third high-side switching element 11w and third low-side switching element 12w. A node between third high-side switching element 11w and third low-side switching element 12w is connected to a W-phase coil (not illustrated) of motor M via third output line LOw.

[Structure of Switching Power Supply Device]

Figure 2:
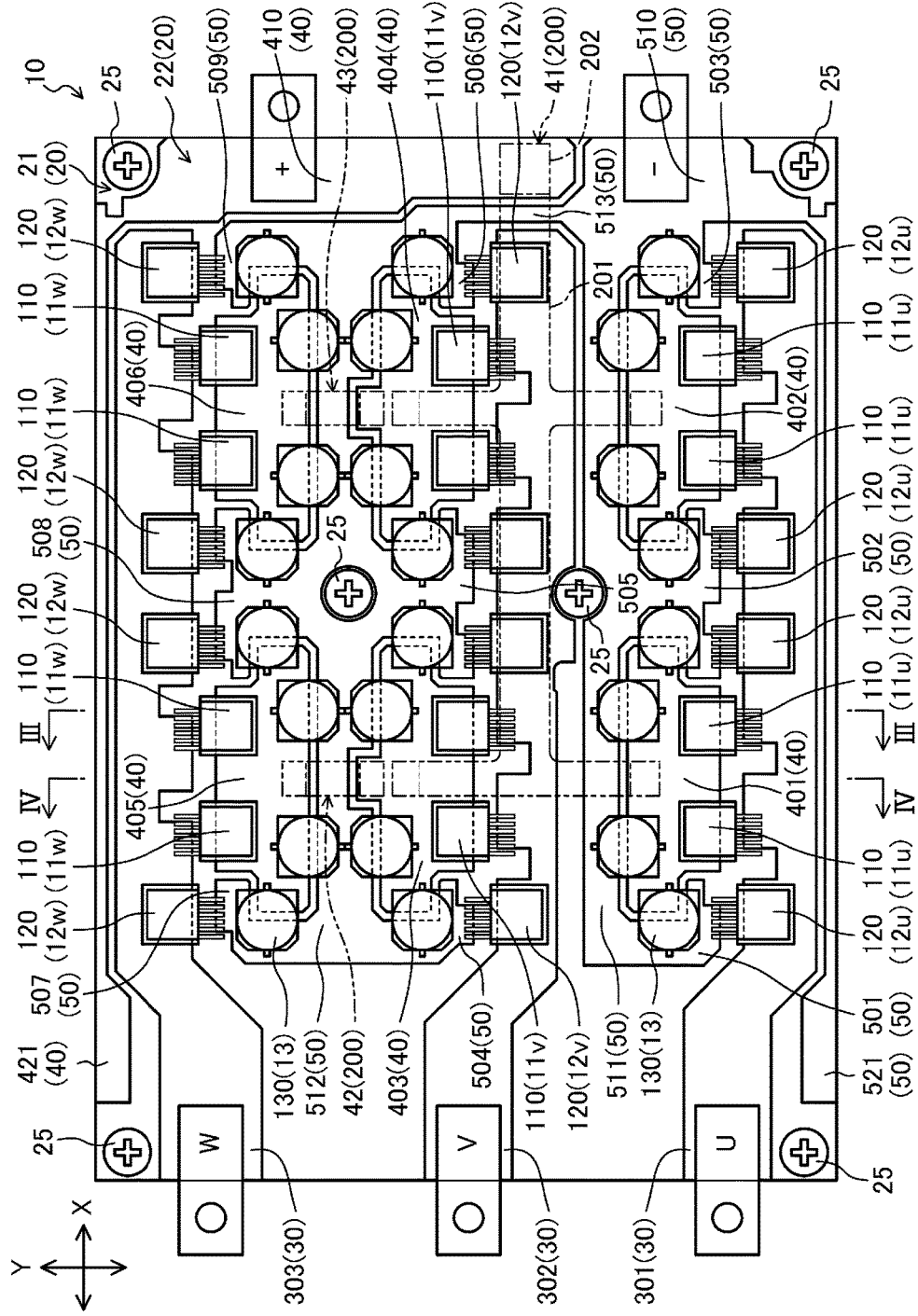
FIG. 2 is a plan view illustrating the configuration of the switching power supply device according to the first exemplary embodiment.
Figure 3:
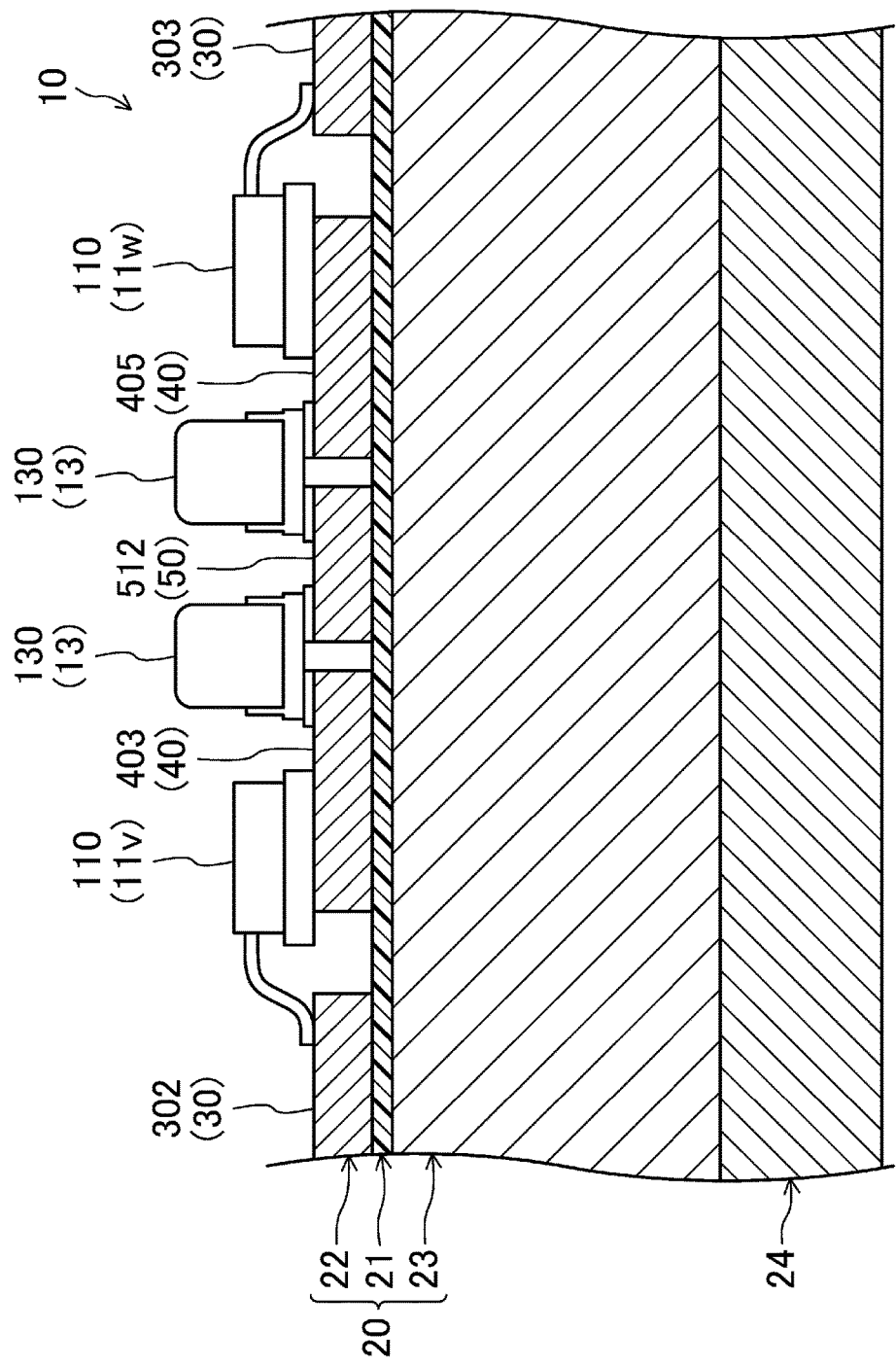
FIG. 3 is a cross-sectional view illustrating the configuration of the switching power supply device according to the first exemplary embodiment.
Figure 4:
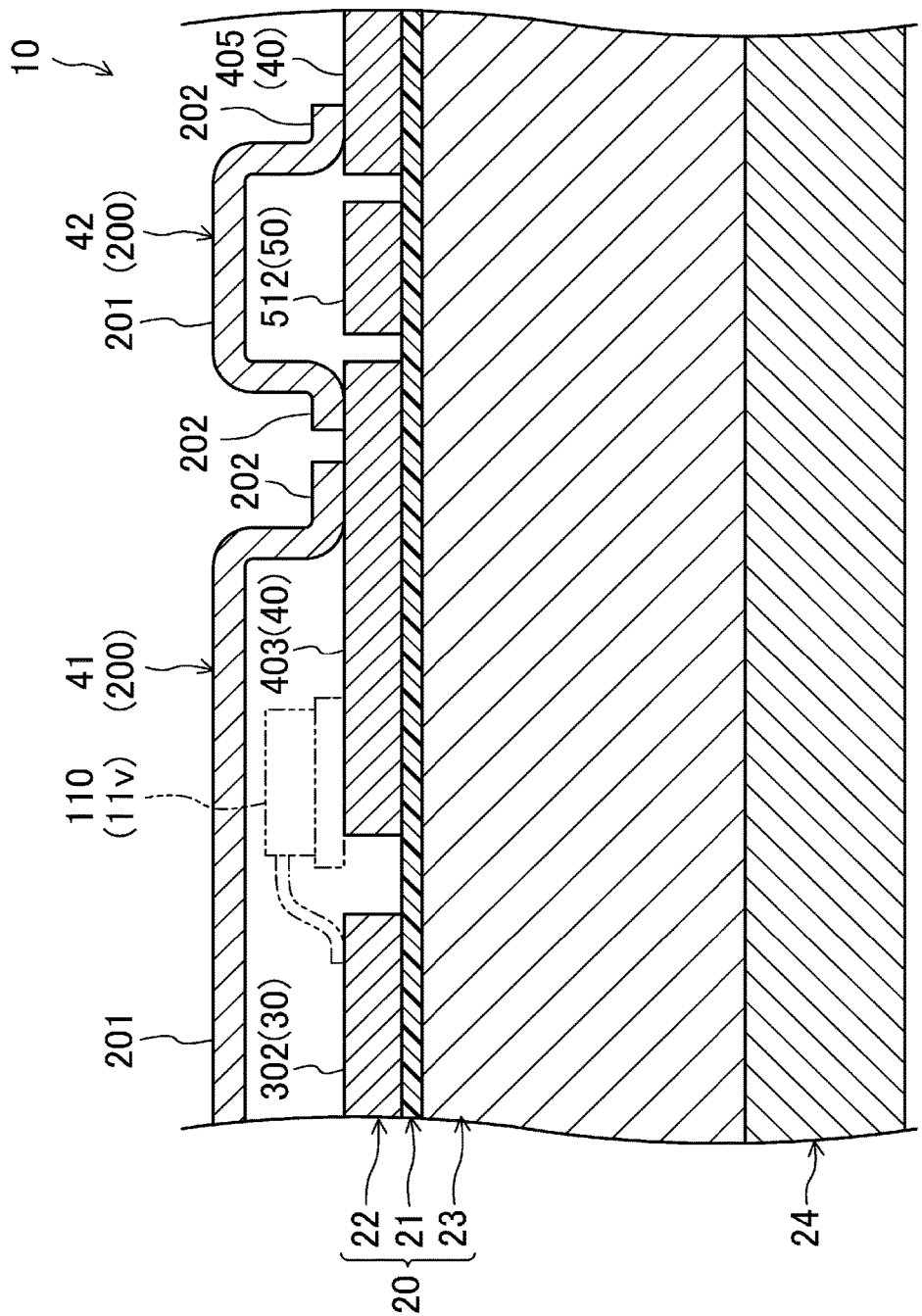
FIG. 4 is a cross-sectional view illustrating the configuration of the switching power supply device according to the first exemplary embodiment.

Next, a description will be given of a structure of switching power supply device 10 according to the first exemplary embodiment, with reference to FIGS. 2, 3, and 4. FIG. 2 is a schematic plan view illustrating a planar structure of switching power supply device 10. FIGS. 3 and 4 are each a schematic cross-sectional view illustrating a part of a cross-sectional structure of switching power supply device 10. FIG. 3 corresponds to a cross-sectional view taken along line III-III in FIG. 2; FIG. 4 corresponds to a cross-sectional view taken along line IV-IV in FIG. 2. Switching power supply device 10 is provided with substrate 20.

<Substrate>

Substrate 20 includes insulating layer 21, conductive layer 22, and heat dissipation layer 23. In this example, substrate 20 is formed in a rectangular planar shape. In the example of FIG. 2, a longitudinal direction of substrate 20 corresponds to first direction X (right-to-left direction in FIG. 2), whereas a lateral direction of substrate 20 corresponds to second direction Y (upper-to-lower direction in FIG. 2).

Insulating layer 21, made of an insulating material (for example, epoxy resin sheet), is formed in a planar shape. Conductive layer 22, made of a conductive material (for example, copper), is provided on one surface of insulating layer 21 and formed into a thin foil. Heat dissipation layer 23, made of a material that conducts heat (for example, aluminum), is provided on the other surface of insulating layer 21.

In this example, insulating layer 21 is smaller in thickness than any of conductive layer 22 and heat dissipation layer 23. Heat dissipation layer 23 is greater in thickness than conductive layer 22. For example, the thickness of insulating layer 21 may be set to about 100 μm, the thickness of conductive layer 22 may be set to about 200 μm, and the thickness of heat dissipation layer 23 may be set in a range from about 1 mm to about 3 mm. A thermal conductivity of insulating layer 21 is lower than a thermal conductivity of any of conductive layer 22 and heat dissipation layer 23. The thermal conductivity of conductive layer 22 is higher than the thermal conductivity of heat dissipation layer 23.

<Heat Dissipation Member>

In this example, heat dissipation layer 23 is bonded and fixed to heat dissipation member 24. For example, heat dissipation member 24 corresponds to a portion of a housing (not illustrated) that contains substrate 20. Heat dissipation member 24 is cooled by means of air cooling (cooled by air) or liquid cooling (cooled by a liquid such as cooling water or cooling oil).

<Fixing Screw>

Substrate 20 is secured to heat dissipation member 24 with a plurality of (six in this example) fixing screws 25. Fixing screws 25 penetrate substrate 20 and are fixed to heat dissipation member 24. More specifically, substrate 20 is provided with insertion holes (not illustrated) through which fixing screws 25 pass. Heat dissipation member 24 is provided with threaded holes (not illustrated) to which fixing screws 25 are fixed. Fixing screws 25 pass through the insertion holes in substrate 20 and are fixed to the threaded holes in heat dissipation member 24. In this case, clearances are formed between threaded portions of fixing screws 25 and the corresponding insertion holes in substrate 20. In addition, insulating members (not illustrated), such as insulating paper, are provided between heads of fixing screws 25 and conductive layer 22 of substrate 20. This configuration reliably electrically insulates conductive layer 22 of substrate 20 from both heat dissipation layer 23 and heat dissipation member 24.

<Wire Pattern>

Conductive layer 22 has wiring patterns formed therein. More specifically, output pattern 30, power supply pattern 40, and ground pattern 50 are formed in conductive layer 22. Output pattern 30, power supply pattern 40, and ground pattern 50 are formed with a predetermined distance therebetween, so that output pattern 30, power supply pattern 40, and ground pattern 50 are not short-circuited.

<Output Pattern>

Output pattern 30 is provided to connect, in series, high-side switching elements 11 to corresponding low-side switching elements 12 in switching section SW. In short, output pattern 30 is a part that forms the intermediate parts (nodes between high-side switching elements 11 and low-side switching elements 12) in switching section SW illustrated in FIG. 1.

In this example, output pattern 30 includes first output region 301 to third output region 303, which correspond to first switching section SWu to third switching section SWw, respectively. Hereinafter, first output region 301 to third output region 303 are collectively referred to as "output regions 300". Output regions 300 are formed so as to extend in first direction X. More specifically, first output region 301 to third output region 303 have configurations described below.

First output region 301 to third output region 303 are formed so as to extend in first direction X, and disposed spaced apart in second direction Y, which is orthogonal to first direction X. In this example, first direction X refers to a direction along the longitudinal direction of substrate 20, whereas second direction Y refers to a direction along the lateral direction of substrate 20. First output region 301 is disposed near one end (lower end in FIG. 2) of substrate 20 in the lateral direction. Second output region 302 is disposed in a middle of substrate 20 in the lateral direction. Third output region 303 is disposed near the other end (upper end in FIG. 2) of substrate 20 in the lateral direction.

<Power Supply Pattern>

Power supply pattern 40 is provided to connect the power supply (DC power supply P in this example) to high-side switching elements 11 of switching sections SW. In short, power supply pattern 40 is a part that forms a portion of power supply wire LP illustrated in FIG. 1.

<<Power Supply Region>>

In this example, power supply pattern 40 includes six wiring regions (first power supply region 401 to sixth power supply region 406). Hereinafter, first power supply region 401 to sixth power supply region 406 are collectively referred to as "power supply regions 400".

The plurality of power supply regions 400 are arrayed spaced apart in an extending direction of output regions 300, and face corresponding output regions 300 with predetermined clearances therebetween in a direction orthogonal to the extending direction of output regions 300. More specifically, first power supply region 401 to sixth power supply region 406 have configurations described below.

Both first power supply region 401 and second power supply region 402 are disposed between first output region 301 and second output region 302, and arrayed spaced apart in an extending direction (first direction X) of first output region 301. In this example, first power supply region 401 and second power supply region 402 are arranged in this order from one end side to the other end side (the left side to the right side in FIG. 2) in the extending direction of first output region 301. In addition, both first power supply region 401 and second power supply region 402 face first output region 301 with a predetermined clearance therebetween in a direction (second direction Y) orthogonal to the extending direction of first output region 301.

Both third power supply region 403 and fourth power supply region 404 are disposed between second output region 302 and third output region 303, and arrayed spaced apart in an extending direction (first direction X) of second output region 302. In this example, third power supply region 403 and fourth power supply region 404 are arranged in this order from one end side to the other end side (the left side to the right side in FIG. 2) in the extending direction of second output region 302. In addition, both third power supply region 403 and fourth power supply region 404 face second output region 302 with a predetermined clearance therebetween in a direction (second direction Y) orthogonal to the extending direction of second output region 302.

Both fifth power supply region 405 and sixth power supply region 406 are disposed between second output region 302 and third output region 303, and arrayed spaced apart in an extending direction (first direction X) of third output region 303. In this example, fifth power supply region 405 and sixth power supply region 406 are arranged in this order from one end side to the other end side (the left side to the right side in FIG. 2) in the extending direction of third output region 303. In addition, both fifth power supply region 405 and sixth power supply region 406 face third output region 303 with a predetermined clearance therebetween in a direction (second direction Y) orthogonal to the extending direction of third output region 303.

<<Power Supply Interconnection Region>>

In this example, power supply pattern 40 includes power supply interconnection region 410. Power supply interconnection region 410 is electrically connected to one end (positive electrode) of DC power supply P. In this example, power supply interconnection region 410 is disposed near an edge part (right edge part in FIG. 2) of substrate 20 in the longitudinal direction. In this example, first power supply region 401 to sixth power supply region 406 are electrically connected to power supply interconnection region 410 via connection members 200 (first power supply connection member 41 to third power supply connection member 43) that will be described later.

<<Extra Power Supply Region>>

In this example, power supply pattern 40 includes extra power supply region 421. Extra power supply region 421 is formed along an edge part (upper edge part in FIG. 2) of substrate 20 in the lateral direction and connected to power supply interconnection region 410.

<Ground Pattern>

Ground pattern 50 is provided to connect the power supply (DC power supply P in this example) to low-side switching elements 12 in switching sections SW. In short, ground pattern 50 is a part that forms a portion of ground wire LG illustrated in FIG. 1.

<<Ground Region>>

In this example, ground pattern 50 includes nine wiring regions (first ground region 501 to ninth ground region 509).

Hereinafter, first ground region 501 to ninth ground region 509 are collectively referred to as "ground regions 500".

Similar to the plurality of power supply regions 400, the plurality of ground regions 500 are arrayed spaced apart in the extending direction of output regions 300, and face corresponding output regions 300 with predetermined clearances therebetween in the direction orthogonal to the extending direction of output regions 300. More specifically, first ground region 501 to ninth ground region 509 have configurations described below.

First ground region 501 to third ground region 503 are disposed between first output region 301 and second output region 302, and arrayed spaced apart in the extending direction (first direction X) of first output region 301. In this example, first ground region 501, second ground region 502, and third ground region 503 are arranged in this order from one end side to the other end side (the left side to the right side in FIG. 2) in the extending direction of first output region 301. In addition, first ground region 501 to third ground region 503 face first output region 301 with a predetermined clearance therebetween in the direction (second direction Y) orthogonal to the extending direction of first output region 301.

Fourth ground region 504 to sixth ground region 506 are disposed between second output region 302 and third output region 303, and arrayed spaced apart in the extending direction (first direction X) of second output region 302. In this example, fourth ground region 504, fifth ground region 505, and sixth ground region 506 are arranged in this order from one end side to the other end side (the left side to the right side in FIG. 2) in the extending direction of second output region 302. In addition, fourth ground region 504 to sixth ground region 506 face second output region 302 with a predetermined clearance therebetween in the direction (second direction Y) orthogonal to the extending direction of second output region 302.

Seventh ground region 507 to ninth ground region 509 are disposed between second output region 302 and third output region 303, and arrayed spaced apart in the extending direction (first direction X) of third output region 303. In this example, seventh ground region 507, eighth ground region 508, and ninth ground region 509 are arranged in this order from one end side to the other end side (the left side to the right side in FIG. 2) in the extending direction of third output region 303. In addition, seventh ground region 507 to ninth ground region 509 face third output region 303 with a predetermined clearance therebetween in the direction (second direction Y) orthogonal to the extending direction of third output region 303.

<<Ground Interconnection Region>>

In this example, ground pattern 50 includes ground interconnection region 510. Ground interconnection region 510 is electrically connected to the other end (negative electrode) of DC power supply P. In this example, ground interconnection region 510 is disposed near an edge part (right edge part in FIG. 2) of substrate 20 in the longitudinal direction. Ground interconnection region 510 and power supply interconnection region 410 are arranged with a predetermined clearance therebetween in the lateral direction of substrate 20.

<<Ground Connection Region>>

In this example, ground pattern 50 includes first ground connection region 511 to third ground connection region 513.

First ground connection region 511 is formed so as to extend in first direction X and disposed between first output region 301 and second output region 302. First power supply region 401, second power supply region 402, and first ground region 501 to third ground region 503 are disposed between first output region 301 and first ground connection region 511. In addition, both first power supply region 401 and second power supply region 402 face first ground connection region 511 with a predetermined clearance therebetween in the direction (second direction Y) orthogonal to the extending direction of first ground connection region 511. First ground region 501 to third ground region 503 are connected to first ground connection region 511.

Second ground connection region 512 is formed so as to extend in first direction X and disposed between second output region 302 and third output region 303. Third power supply region 403, fourth power supply region 404, and fourth ground region 504 to sixth ground region 506 are disposed between second output region 302 and second ground connection region 512. In addition, both third power supply region 403 and fourth power supply region 404 face second ground connection region 512 with a predetermined clearance therebetween in the direction (second direction Y) orthogonal to the extending direction of second ground connection region 512. Fourth ground region 504 to sixth ground region 506 are connected to second ground connection region 512. Fifth power supply region 405, sixth power supply region 406, and seventh ground region 507 to ninth ground region 509 are disposed between second ground connection region 512 and third output region 303. In addition, both fifth power supply region 405 and sixth power supply region 406 face second ground connection region 512 with a predetermined clearance therebetween in the direction (second direction Y) orthogonal to the extending direction of second ground connection region 512. Seventh ground region 507 to ninth ground region 509 are connected to second ground connection region 512.

Third ground connection region 513 is formed so as to extend in second direction Y and disposed between second output region 302 and power supply interconnection region 410. In addition, third ground connection region 513 connects ground interconnection region 510 and first connection region 511, second connection region 512.

<<Extra Ground Region>>

In this example, ground pattern 50 includes extra ground region 521. Extra ground region 521 is formed along an edge part (lower edge part in FIG. 2) of substrate 20 in the lateral direction and connected to ground interconnection region 510.

<Arrangement of Power Supply Regions and Ground Regions>

The plurality of power supply regions 400 and the plurality of ground regions 500 are alternately arrayed in a direction along the extending direction of output regions 300. Furthermore, the plurality of power supply regions 400 and the plurality of ground regions 500 are arrayed such that adjacent pairs of power supply region 400 and ground region 500 face each other with a predetermined clearance therebetween.

More specifically, between first output region 301 and second output region 302 (between first output region 301 and first ground connection region 511 in the example of FIG. 2), first ground region 501, first power supply region 401, second ground region 502, second power supply region 402, and third ground region 503 are arranged in this order from one end side to the other end side (the left side to the right side in FIG. 2) in first direction X, which is along the extending direction of first output region 301. First power supply region 401 faces both first ground region 501 and second ground region 502 with a predetermined clearance therebetween. Likewise, second power supply region 402 faces both second ground region 502 and third ground region 503 with a predetermined clearance therebetween.

Between second output region 302 and third output region 303 (between second output region 302 and second ground connection region 512 in the example of FIG. 2), fourth ground region 504, third power supply region 403, fifth ground region 505, fourth power supply region 404, and sixth ground region 506 are arranged in this order from one end side to the other end side (the left side to the right side in FIG. 2) in first direction X, which is along the extending direction of second output region 302. Third power supply region 403 faces both fourth ground region 504 and fifth ground region 505 with a predetermined clearance therebetween. Likewise, fourth power supply region 404 faces both fifth ground region 505 and sixth ground region 506 with a predetermined clearance therebetween.

Between second output region 302 and third output region 303 (between second ground connection region 512 and third output region 303 in the example of FIG. 2), seventh ground region 507, fifth power supply region 405, eighth ground region 508, sixth power supply region 406, and ninth ground region 509 are arranged in this order from one end side to the other end side (the left side to the right side in FIG. 2) in first direction X, which is along the extending direction of third output region 303. Fifth power supply region 405 faces both seventh ground region 507 and eighth ground region 508 with a predetermined clearance therebetween. Likewise, sixth power supply region 406 faces both eighth ground region 508 and ninth ground region 509 with a predetermined clearance therebetween.

<High-Side Switching Element and High-Side Transistor>

In switching power supply device 10, conductive layer 22 of substrate 20 is provided with high-side switching elements 11. Each of high-side switching elements 11 includes a plurality of high-side transistors 110. More specifically, the plurality of high-side transistors 110 are connected in parallel to constitute high-side switching element 11. In short, switching power supply device 10 includes the plurality of high-side transistors 110 that constitute high-side switching elements 11.

High-side transistors 110 are connected to power supply pattern 40 and to output pattern 30. In this example, high-side transistors 110 are mounted on a surface of power supply pattern 40 and connected to output pattern 30. More specifically, high-side transistors 110 are mounted on power supply pattern 40. One end (drain) of each of high-side transistors 110, which is formed in a planar shape, is disposed on a bottom of the main body of high-side transistor 110 and bonded to the surface of power supply pattern 40 with soldering. Another end (source) of each of high-side transistors 110 extends from a side of the main body of high-side transistor 110 to output pattern 30 and is bonded to a surface of output pattern 30 with soldering. A gate of each of high-side transistors 110 is electrically connected to a gate wire (not illustrated). For example, each of high-side transistors 110 may be a surface-mounted type of field effect transistor (FET).

More specifically, in this example, conductive layer 22 of substrate 20 is provided with first high-side switching element 11$u$ to third high-side switching element 11$w$. Each of first high-side switching element 11$u$ to third high-side switching element 11$w$ includes four high-side transistors 110.

Four high-side transistors 110 constituting first high-side switching element 11$u$ are disposed spaced apart in first direction X, which is along the extending direction of first output region 301. Out of these four high-side transistors 110, two high-side transistors 110 are mounted on a surface of first power supply region 401 and connected to first output region 301, and two remaining high-side transistors 110 are mounted on a surface of second power supply region 402 and connected to first output region 301.

Four high-side transistors 110 constituting second high-side switching element 11$v$ are disposed spaced apart in first direction X, which is along the extending direction of second output region 302. Out of these four high-side transistors 110, two high-side transistors 110 are mounted on a surface of third power supply region 403 and connected to second output region 302, and two remaining high-side transistors 110 are mounted on a surface of fourth power supply region 404 and connected to second output region 302.

Four high-side transistors 110 constituting third high-side switching element 11$w$ are disposed spaced apart in first direction X, which is along the extending direction of third output region 303. Out of these four high-side transistors 110, two high-side transistors 110 are mounted on a surface of fifth power supply region 405 and connected to third output region 303, and two remaining high-side transistors 110 are mounted on a surface of sixth power supply region 406 and connected to third output region 303.

<Low-Side Switching Element and Low-Side Transistor>

In switching power supply device 10, conductive layer 22 of substrate 20 is provided with low-side switching elements 12. Low-side switching elements 12 include a plurality of low-side transistors 120. More specifically, the plurality of low-side transistors 120 are connected in parallel to constitute low-side switching element 12. In short, switching power supply device 10 includes the plurality of low-side transistors 120 that constitute low-side switching elements 12.

Low-side transistors 120 are connected to ground pattern 50 and to output pattern 30. In this example, low-side transistors 120 are mounted on the surface of output pattern 30 and connected to ground pattern 50. More specifically, low-side transistors 120 are mounted on output pattern 30. One end (drain) of each of low-side transistors 120, which is formed in a planar shape, is disposed on a bottom of the main body of low-side transistor 120 and bonded to the surface of output pattern 30 with soldering. Another end (source) of each of low-side transistors 120 extends from a side of the main body of low-side transistor 120 to ground pattern 50 and is bonded to the surface of ground pattern 50 with soldering. A gate of each of low-side transistors 120 is electrically connected to a gate wire (not illustrated). For example, each of low-side transistors 120 may be a surface-mounted type of field effect transistor (FET).

More specifically, in this example, conductive layer 22 of substrate 20 is provided with first low-side switching element 12$u$ to third low-side switching element 12$w$. Each of first low-side switching element 12$u$ to third low-side switching element 12$w$ includes four low-side transistors 120.

Four low-side transistors 120 constituting first low-side switching element 12$u$ are disposed spaced apart in first direction X, which is along the extending direction of first output region 301. Out of these four low-side transistors 120, one low-side transistor 120 is mounted on a surface of first output region 301 and connected to first ground region 501; two low-side transistors 120 are mounted on the surface of first output region 301 and connected to second ground region 502; and one remaining low-side transistor 120 is mounted on the surface of first output region 301 and connected to third ground region 503.

Four low-side transistors 120 constituting second low-side switching element 12v are disposed spaced apart in first direction X, which is along the extending direction of second output region 302. Out of these four low-side transistors 120, one low-side transistor 120 is mounted on a surface of second output region 302 and connected to fourth ground region 504; two low-side transistors 120 are mounted on the surface of second output region 302 and connected to fifth ground region 505; and one remaining low-side transistor 120 is mounted on the surface of second output region 302 and connected to sixth ground region 506.

Four low-side transistors 120 constituting third low-side switching element 12w are disposed spaced apart in first direction X, which is along the extending direction of third output region 303. Out of these four low-side transistors 120, one low-side transistor 120 is mounted on a surface of third output region 303 and connected to seventh ground region 507; two low-side transistors 120 are mounted on the surface of third output region 303 and connected to eighth ground region 508; and one remaining low-side transistor 120 is mounted on the surface of third output region 303 and connected to ninth ground region 509.

<Arrangement of High-Side Transistors and Low-Side Transistors>

In switching power supply device 10, the plurality of high-side transistors 110 that constitute single high-side switching element 11 are arranged, one by one, next to the plurality of low-side transistors 120 that constitute single low-side switching element 12 in first direction X, which is along the extending direction of output regions 300. In this case, a direction in which terminals of low-side transistors 120 (terminals protruding from sides of main bodies to ground regions 500) are oriented is opposite to a direction in which terminals of high-side transistor 110 (terminals protruding from sides of main bodies to output regions 300) are orientated.

More specifically, four high-side transistors 110 that constitute first high-side switching element 11u and four low-side transistors 120 that constitute first low-side switching element 12u are arrayed in first direction X, which is along the extending direction of first output region 301 such that one low-side transistor 120, two high-side transistors 110, two low-side transistors 120, two high-side transistors 110, and one low-side transistor 120 are arranged in this order from one side to the other side (the left side to the right side in FIG. 2) in first direction X.

More specifically, four high-side transistors 110 that constitute second high-side switching element 11v and four low-side transistors 120 that constitute second low-side switching element 12v are arrayed in first direction X, which is along the extending direction of second output region 302 such that one low-side transistor 120, two high-side transistors 110, two low-side transistors 120, two high-side transistors 110, and one low-side transistor 120 are arranged in this order from one side to the other side (the left side to the right side in FIG. 2) in first direction X.

More specifically, four high-side transistors 110 that constitute third high-side switching element 11w and four low-side transistors 120 that constitute third low-side switching element 12w are arrayed in first direction X, which is along the extending direction of third output region 303 such that one low-side transistor 120, two high-side transistors 110, two low-side transistors 120, two high-side transistors 110, and one low-side transistor 120 are arranged in this order from one side to the other side (the left side to the right side in FIG. 2) in first direction X.

<Smoothing Capacitor Section and Capacitor>

In switching power supply device 10, conductive layer 22 of substrate 20 is provided with smoothing capacitor section 13. Smoothing capacitor section 13 includes a plurality of capacitors 130. In short, switching power supply device 10 includes the plurality of capacitors 130 that constitute smoothing capacitor section 13.

The plurality of capacitors 130 are connected to power supply pattern 40 and to ground pattern 50. In this example, capacitors 130 are mounted on the surfaces of power supply pattern 40 and ground pattern 50. More specifically, capacitors 130 are placed so as to extend from power supply pattern 40 and ground pattern 50. One end (positive electrode) of each of capacitors 130 is bonded to the surface of power supply pattern 40 with soldering, whereas the other end (negative electrode) of each of capacitors 130 is bonded to the surface of ground pattern 50 with soldering. For example, each of capacitors 130 may be an electrolytic capacitor, a film capacitor, or a ceramic capacitor.

The plurality of capacitors 130 correspond to the plurality of high-side transistors 110 and the plurality of low-side transistors 120. Each of the plurality of capacitors 130 is disposed next to its corresponding transistor of the plurality of high-side transistors 110 and the plurality of low-side transistors 120. In this example, the plurality of capacitors 130 are disposed spaced apart in first direction X, which is along an array direction (extending direction of output regions 300) of the plurality of high-side transistors 110 and the plurality of low-side transistors 120. In second direction Y orthogonal to first direction X, which is along the array direction (extending direction of output regions 300) of the plurality of high-side transistors 110 and the plurality of low-side transistors 120, each of the plurality of capacitors 130 is disposed next to its corresponding transistor of high-side transistors 110 and the plurality of low-side transistors 120. In other words, the plurality of high-side transistors 110, the plurality of low-side transistors 120, and the plurality of capacitors 130 are disposed such that pairs each including high-side transistor 110 and its corresponding capacitor 130 are positioned next to pairs each including low-side transistor 120 and its corresponding capacitor 130.

More specifically, in this example, 24 capacitors 130 are provided, which correspond to 12 high-side transistors 110 and 12 low-side transistors 120 provided in conductive layer 22 of substrate 20.

Four capacitors 130 corresponding to respective four high-side transistors 110 constituting first high-side switching element 11u are disposed spaced apart in first direction X, which is along the array direction of these four high-side transistors 110 (extending direction of first output region 301), and are provided near the four high-side transistors 110. Out of the four capacitors 130, two capacitors 130 are mounted on the surfaces of first power supply region 401 and first ground connection region 511, and two remaining capacitors 130 are mounted on the surfaces of second power supply region 402 and first ground connection region 511.

Four capacitors 130 corresponding to respective four high-side transistors 110 constituting second high-side switching element 11v are disposed spaced apart in first direction X, which is along the array direction of these four high-side transistors 110 (extending direction of second output region 302), and are provided near the four high-side transistors 110. Out of the four capacitors 130, two capacitors 130 are mounted on the surfaces of third power supply region 403 and second ground connection region 512, and two remaining capacitors 130 are mounted on the surfaces of fourth power supply region 404 and second ground connection region 512.

Four capacitors 130 corresponding to respective four high-side transistors 110 constituting third high-side switching element 11w are disposed spaced apart in first direction X, which is along the array direction of these four high-side transistors 110 (extending direction of third output region 303), and are provided near the four high-side transistors 110. Out of the four capacitors 130, two capacitors 130 are mounted on the surfaces of fifth power supply region 405 and second ground connection region 512, and two remaining capacitors 130 are mounted on the surfaces of sixth power supply region 406 and second ground connection region 512.

Four capacitors 130 corresponding to respective four low-side transistors 120 constituting first low-side switching element 12u are disposed spaced apart in first direction X, which is along the array direction of these four low-side transistors 120 (extending direction of first output region 301), and are provided near the four low-side transistors 120. Out of these four capacitors 130, one capacitor 130 is mounted on the surfaces of first power supply region 401 and first ground region 501; one capacitor 130 is mounted on the surfaces of first power supply region 401 and second ground region 502; one capacitor 130 is mounted on the surfaces of second power supply region 402 and second ground region 502; and one remaining capacitor 130 is mounted on the surfaces of second power supply region 402 and third ground region 503.

Four capacitors 130 corresponding to respective four low-side transistors 120 constituting second low-side switching element 12v are disposed spaced apart in first direction X, which is along the array direction of these four low-side transistors 120 (extending direction of second output region 302), and are provided near the four low-side transistors 120. Out of these four capacitors 130, one capacitor 130 is mounted on the surfaces of third power supply region 403 and fourth ground region 504; one capacitor 130 is mounted on the surfaces of third power supply region 403 and fifth ground region 505; one capacitor 130 is mounted on the surfaces of fourth power supply region 404 and fifth ground region 505; and one remaining capacitor 130 is mounted on the surfaces of fourth power supply region 404 and fifth ground region 505.

Four capacitors 130 corresponding to respective four low-side transistors 120 constituting third low-side switching element 12w are disposed spaced apart in first direction X, which is along the array direction of these four low-side transistors 120 (extending direction of third output region 303), and are provided near the four low-side transistors 120. Out of these four capacitors 130, one capacitor 130 is mounted on the surfaces of fifth power supply region 405 and seventh ground region 507; one capacitor 130 is mounted on the surfaces of fifth power supply region 405 and eighth ground region 508; one capacitor 130 is mounted on the surfaces of sixth power supply region 406 and eighth ground region 508; and one remaining capacitor 130 is mounted on the surfaces of sixth power supply region 406 and ninth ground region 509.

<Connection Member>

In switching power supply device 10, at least one of power supply pattern 40 and ground pattern 50 has a plurality of wiring regions (portions of the wire patterns formed in conductive layer 22) electrically connected via connection members 200. In this example, power supply pattern 40 has first power supply region 401 to sixth power supply region 406 electrically connected via first power supply connection member 41 to third power supply connection member 43 (connection members 200). FIG. 2 illustrates first power supply connection member 41 to third power supply connection member 43 (connection members 200) with alternate long and two short dashes lines.

First power supply connection member 41 electrically connects power supply interconnection region 410, first power supply region 401, second power supply region 402, third power supply region 403, and fourth power supply region 404. Second power supply connection member 42 electrically connects third power supply region 403 to fifth power supply region 405. Third power supply connection member 43 electrically connects fourth power supply region 404 to sixth power supply region 406.

In this example, each of connection members 200 is made of a conductor (so-called bus bar) having a planar shape. More specifically, each connection member 200 has main body 201 and extending parts 202; main body 201 is formed in a planar shape and faces conductive layer 22 with a distance therebetween; and each of extending parts 202 extends from main body 201 to any one of the plurality of wiring regions in conductive layer 22. For example, first power supply connection member 41 has main body 201 and five extending parts 202; main body 201 faces second output region 302 with a distance therebetween, and extending parts 202 extend from main body 201 to respective five wiring regions (power supply interconnection region 410, first power supply region 401, second power supply region 402, third power supply region 403, and fourth power supply region 404) of power supply pattern 40.

In this example, connection members 200 are bonded to the plurality of wiring regions in conductive layer 22 with soldering. For example, five extending parts 202 of first power supply connection member 41 are bonded, with soldering, to the respective five wiring regions (power supply interconnection region 410, first power supply region 401, second power supply region 402, third power supply region 403, and fourth power supply region 404) of power supply pattern 40.

In this example, a material of connection members 200 may be of the same type as a type of a material of heat dissipation layer 23. In this example, portions of each connection member 200 which are bonded to the plurality of wiring regions with soldering may be subjected to plate processing, in order to enable solder bonding. For example, each of first power supply connection member 41 and heat dissipation layer 23 may be made of aluminum. In first power supply connection member 41, five extending parts 202 that are bonded, with soldering, to the five wiring regions (power supply interconnection region 410, first power supply region 401, second power supply region 402, third power supply region 403, and fourth power supply region 404) of power supply pattern 40 are plated with nickel (material that enables solder bonding).

[Effect of First Exemplary Embodiment]

In switching power supply device 10, as described above, high-side transistors 110 are arranged, one by one, next to the plurality of low-side transistors 120. With this configuration, when heat is generated in one of high-side transistor 110 and low-side transistor 120 arranged next to each other, the generated heat can be transmitted to the other transistor via substrate 20. More specifically, during a period in which high-side switching element 11 is in an ON state and low-side switching element 12 is in an OFF state, heat generated in high-side transistors 110 in the ON state can be transmitted to low-side transistors 120 in the OFF state via substrate 20. During a period in which high-side switching element 11 is in an OFF state and low-side switching element 12 is in an ON state, heat generated in low-side transistors 120 in the ON state can be transmitted to high-side transistors 110 in the OFF state via substrate 20. In this way, it is possible to reduce heat concentration in high-side switching elements 11 and low-side switching elements 12.

Conductive layer 22 of substrate 20 is provided with high-side transistors 110 and low-side transistors 120 as well as smoothing capacitor section 13. This configuration can shorten wiring paths between smoothing capacitor section 13 and high-side transistors 110 and between smoothing capacitor section 13 and low-side transistors 120, compared to a configuration in which no smoothing capacitor section 13 is provided in conductive layer 22 of substrate 20 (for example, a configuration in which smoothing capacitor section 13 is provided in a substrate different from substrate 20 on which high-side transistors 110 and low-side transistors 120 are mounted. Consequently, it is possible to reduce parasitic inductance of the wiring paths between smoothing capacitor section 13 and high-side transistors 110 and smoothing capacitor section 13 and low-side transistors 120, thereby reducing surge voltage caused by switching operations of high-side transistors 110 and low-side transistors 120.

The plurality of capacitors 130 constituting smoothing capacitor section 13 are disposed such that high-side transistors 110 are arranged next to the plurality of low-side transistors 120. This configuration can shorten the wiring paths between capacitors 130 and high-side transistors 110 (or low-side transistors 120). Consequently, it is possible to reduce surge voltage caused by the switching operations of high-side transistors 110 and low-side transistors 120.

The plurality of high-side transistors 110, the plurality of low-side transistors 120, and the plurality of capacitors 130 are disposed such that pairs each including high-side transistor 110 and its corresponding capacitor 130 are positioned next to pairs each including low-side transistor 120 and its corresponding capacitor 130. This configuration can shorten the wiring paths formed between high-side transistors 110 and capacitors 130 and between low-side transistors 120 and capacitors 130. Consequently, it is possible to reduce surge voltage caused by the switching operations of high-side transistors 110 and low-side transistors 120.

In switching power supply device 10, the plurality of high-side transistors 110 are arranged, one by one, next to the plurality of low-side transistors 120 in first direction X. Furthermore, each of the plurality of capacitors 130 is disposed next to its corresponding transistor of high-side transistors 110 and the plurality of low-side transistors 120 in second direction Y, which is orthogonal to first direction X. This configuration can reduce variations in wire lengths between the plurality of capacitors 130 and transistors (high-side transistors 110 or low-side transistors 120). In this way, it is possible to reduce non-uniform heat in the plurality of capacitors 130 (to prevent electric current from being concentrated in some of capacitors 130 to heat these capacitors 130).

In this example, power supply pattern 40 has the plurality of wiring regions (first power supply region 401 to sixth power supply region 406 in this example) connected via connection members 200 (first power supply connection member 41 to third power supply connection member 43 in this example). This configuration improves a degree of freedom of designing power supply pattern 40 (wire patterns). Consequently, it is possible to improve a degree of freedom of disposing high-side transistors 110 and low-side transistors 120.

Each of connection members 200 (first power supply connection member 41 to third power supply connection member 43 in this example) is formed of a conductor having a planar shape. This configuration can radiate, via connection members 200, heat that has been transmitted to the wiring regions (first power supply region 401 to sixth power supply region 406 in this example) of conductive layer 22. In this way, it is possible to improve a heat dissipation property.

Each of connection members 200 (first power supply connection member 41 to third power supply connection member 43 in this example) is made of a material of the same type as a type of material of heat dissipation layer 23. Thus, coefficients of thermal expansion of connection members 200 and heat dissipation layer 23 can be made to coincide with each other. Consequently, it is possible to allow connection members 200 to be deformed in conformity with a shape of heat dissipation layer 23 upon temperature rise, thereby improving reliability of switching power supply device 10.

Connection members 200 (first power supply connection member 41 to third power supply connection member 43 in this example) are bonded to the wiring regions (first power supply region 401 to sixth power supply region 406 in this example) of conductive layer 22 with soldering. This configuration can achieve a simple connection structure of connection members 200, compared to a configuration in which connection members 200 are secured to the wiring regions of conductive layer 22 by screws.

Portions of connection members 200 (first power supply connection member 41 to third power supply connection member 43 in this example) which are to be bonded to the wiring regions (first power supply region 401 to sixth power supply region 406 in this example) with soldering are subjected to plate processing, in order to enable solder bonding. This configuration can bond connection members 200 to the wiring regions of conductive layer 22 with soldering even when connection members 200 are made of a material unsuitable for solder bonding. Consequently, it is possible to improve the degree of freedom of selecting a material of connection members 200.

(First Modification of Connection Structure of Connection Member)

Figure 5:
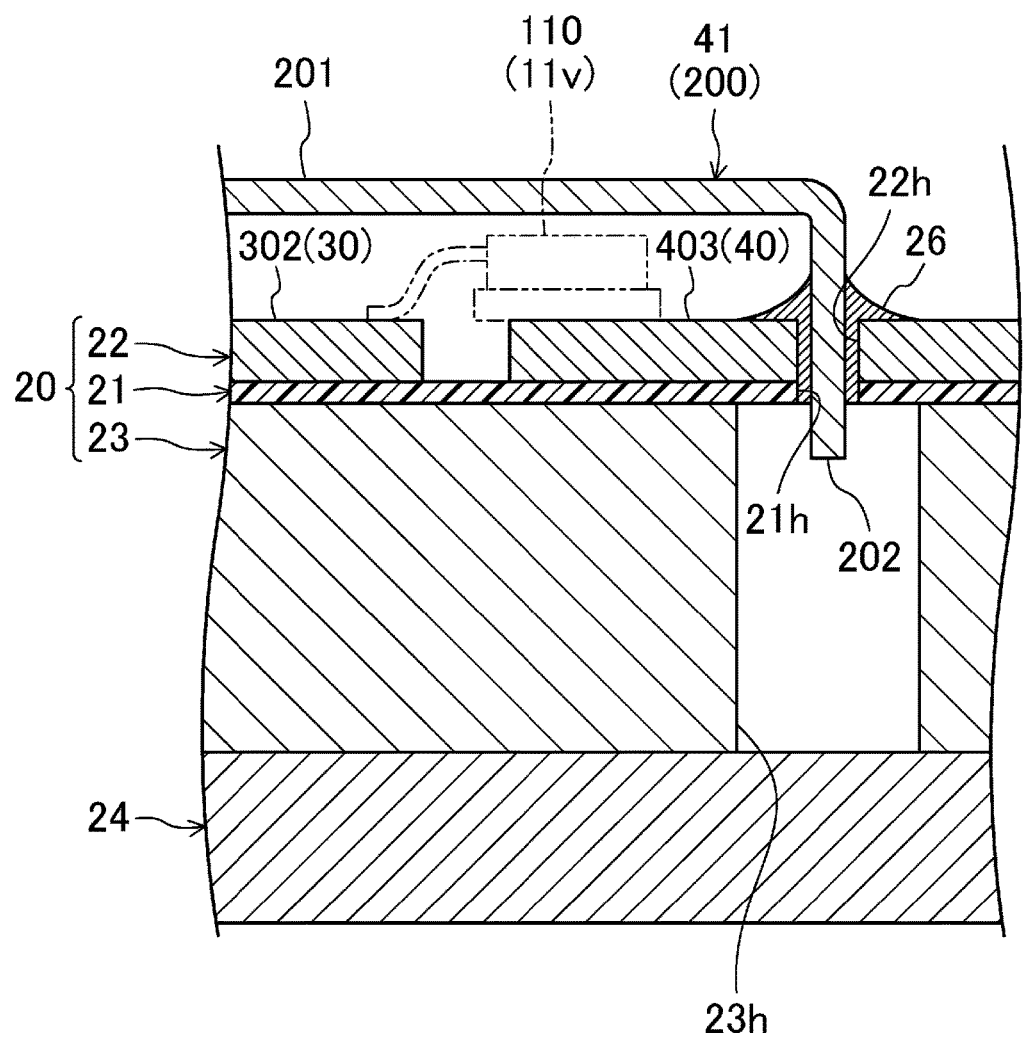
FIG. 5 is a cross-sectional view illustrating a first modification of a connection structure of a connection member.

FIG. 5 illustrates a first modification of a connection structure of connection member 200. In FIG. 5, the connection structure of first power supply connection member 41 and third power supply region 403 is exemplified.

In this example, each of connection members 200 (first power supply connection member 41 in the example of FIG. 5) is made of a conductor (so-called bus bar) having a planar shape. More specifically, each connection member 200 has main body 201 and extending parts 202; main body 201 is formed in a planar shape and faces conductive layer 22 with a distance therebetween; and each of extending parts 202 protrudes from main body 201 to any one of the plurality of wiring regions (third power supply region 403 in the example of FIG. 5) in conductive layer 22.

Substrate 20 is provided with first through holes 21h, second through holes 22h, and third through holes 23h. Each of first through holes 21h penetrates insulating layer 21 in a thickness direction. Each of second through holes 22h is formed so as to penetrate any one of the plurality of wiring regions (third power supply region 403 in the example of FIG. 5) in conductive layer 22 in the thickness direction, and communicates with corresponding first through hole 21h. Each of third through holes 23h penetrates heat dissipation layer 23 in the thickness direction and communicates with corresponding first through hole 21h.

Extending parts 202 of connection members 200 (first power supply connection member 41 in the example of FIG. 5) are bonded, with soldering (solder joint 26), to wiring regions (third power supply region 403 in the example of FIG. 5) having second through holes 22h, which are some of the plurality of wiring regions in conductive layer 22, while inserted into first through holes 21h, second through holes 22h, and third through holes 23h.

Third through holes 23h have a larger opening area than an opening area of first through holes 21h, so that extending parts 202 of connection member 200 (first power supply connection member 41 in the example of FIG. 5) inserted into first through hole 21h, second through hole 22h, and third through hole 23h do not make contact with inner walls of third through holes 23h.

In this example, a material of each connection member 200 (first power supply connection member 41 in the example of FIG. 5) may be of the same type as a type of a material of heat dissipation layer 23. In this example, portions of connection members 200 (extending parts 202 of first power supply connection member 41 in the example of FIG. 5) which are bonded to the plurality of wiring regions with soldering may be subjected to plate processing, in order to enable solder bonding.

As described above, connection members 200 (first power supply connection member 41 in the example of FIG. 5) are bonded to the wiring regions (third power supply region 403 in the example of FIG. 5) of conductive layer 22 with soldering. This configuration can achieve a simple connection structure of connection members 200, compared to a configuration in which connection members 200 are secured to the wiring regions of conductive layer 22 by screws.

(Second Modification of Connection Structure of Connection Member)

Figure 6:
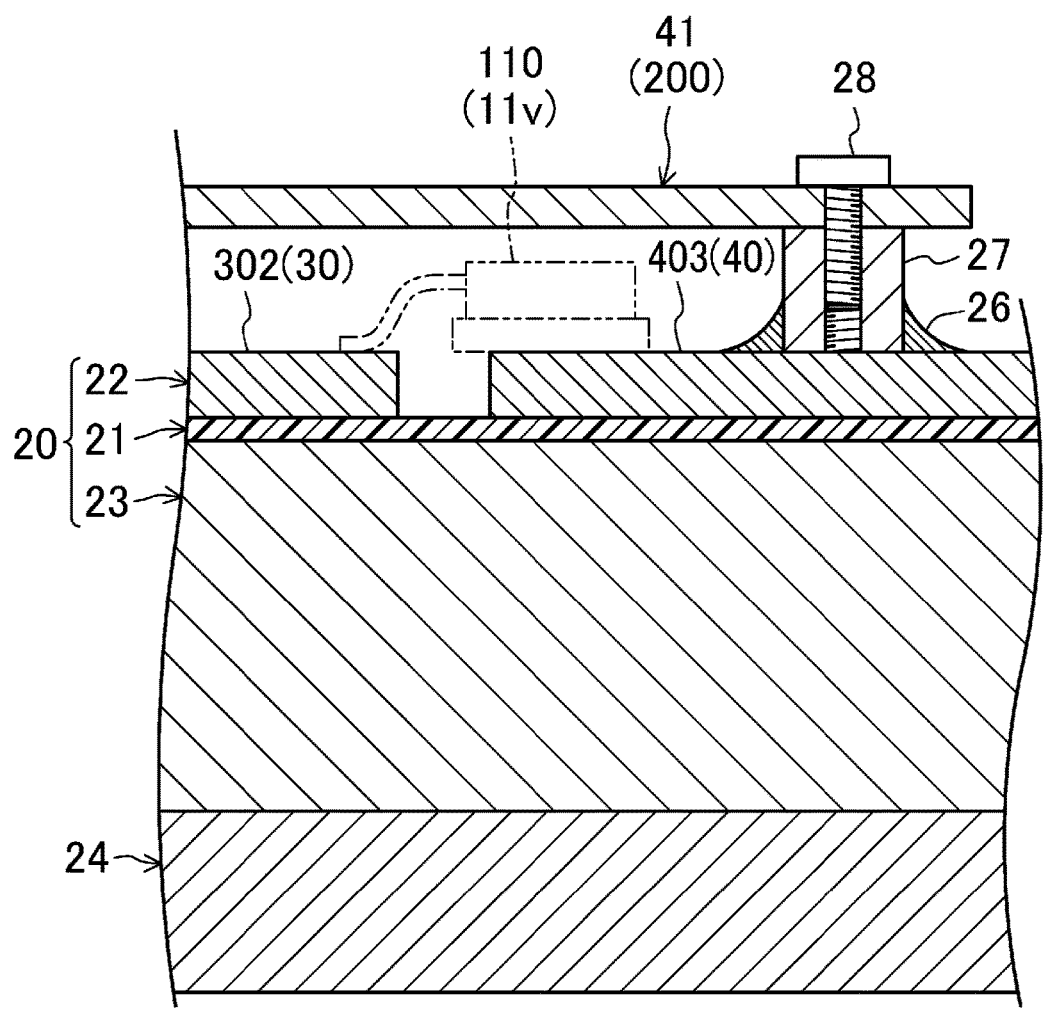
FIG. 6 is a cross-sectional view illustrating a second modification of the connection structure of the connection member.

FIG. 6 illustrates a second modification of a connection structure of connection member 200. In FIG. 6, the connection structure of first power supply connection member 41 and third power supply region 403 is exemplified.

In this example, each of connection members 200 (first power supply connection member 41 in the example of FIG. 6) is made of a conductor (so-called bus bar) having a planar shape. Switching power supply device 10 has nuts 27 and bolts 28; each of nuts 27 is bonded, with soldering (solder joint 26), to any one of the plurality of wiring regions (third power supply region 403 in the example of FIG. 6) in conductive layer 22, and each of bolts 28 penetrates connection member 200 (first power supply connection member 41 in the example of FIG. 6) and is fixed to corresponding nut 27.

In this example, a material of each connection member 200 (first power supply connection member 41 in the example of FIG. 6) may be of the same type as a type of a material of heat dissipation layer 23.

As described above, nuts 27 are bonded, with soldering, to the wiring regions (third power supply region 403 in the example of FIG. 6) in conductive layer 22, and bolts 28 penetrate connection members 200 (first power supply connection member 41 in the example of FIG. 6) and are fixed to nuts 27. This configuration can bond connection members 200 to the wiring regions of conductive layer 22 with soldering even when connection members 200 are made of a material unsuitable for solder bonding. Consequently, it is possible to improve the degree of freedom of selecting a material of connection members 200.

(Third Modification of Connection Structure of Connection Member)

Figure 7:
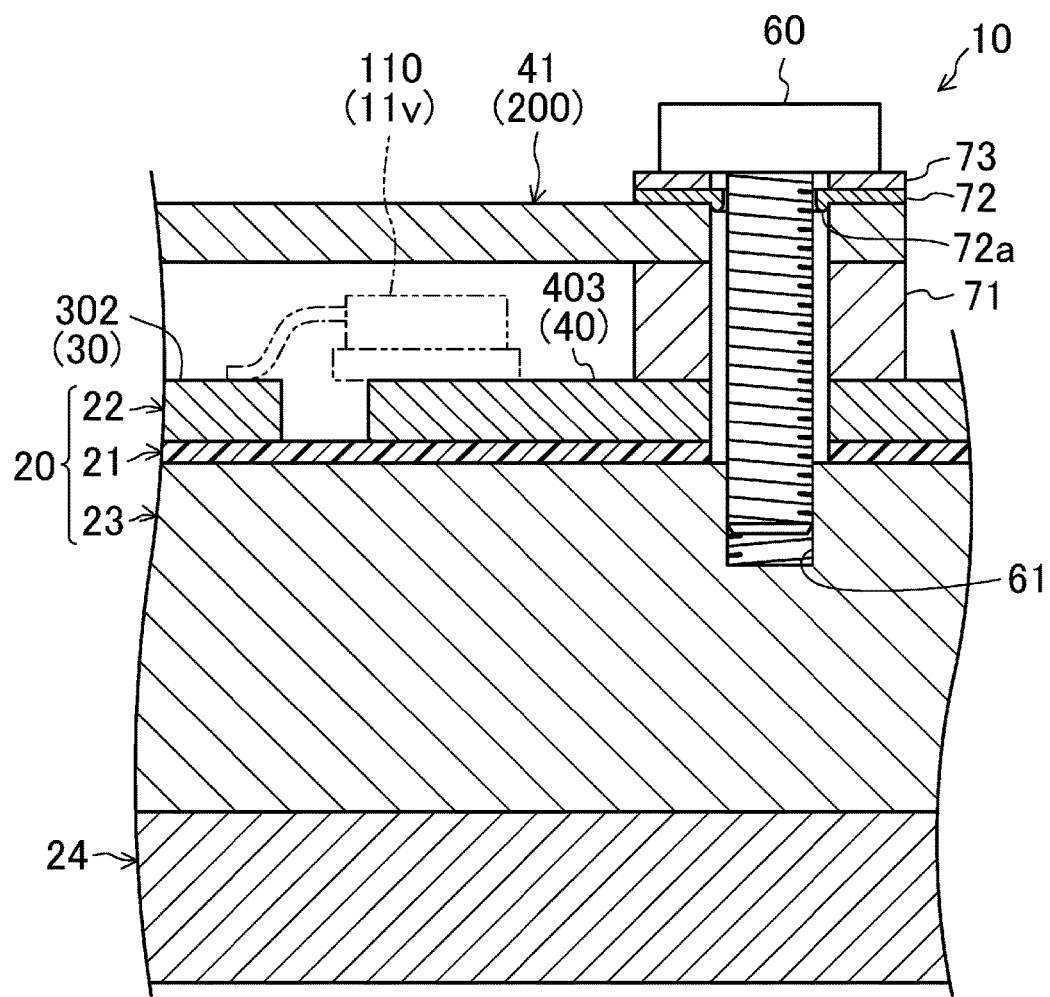
FIG. 7 is a cross-sectional view illustrating a third modification of the connection structure of the connection member.
Figure 8:
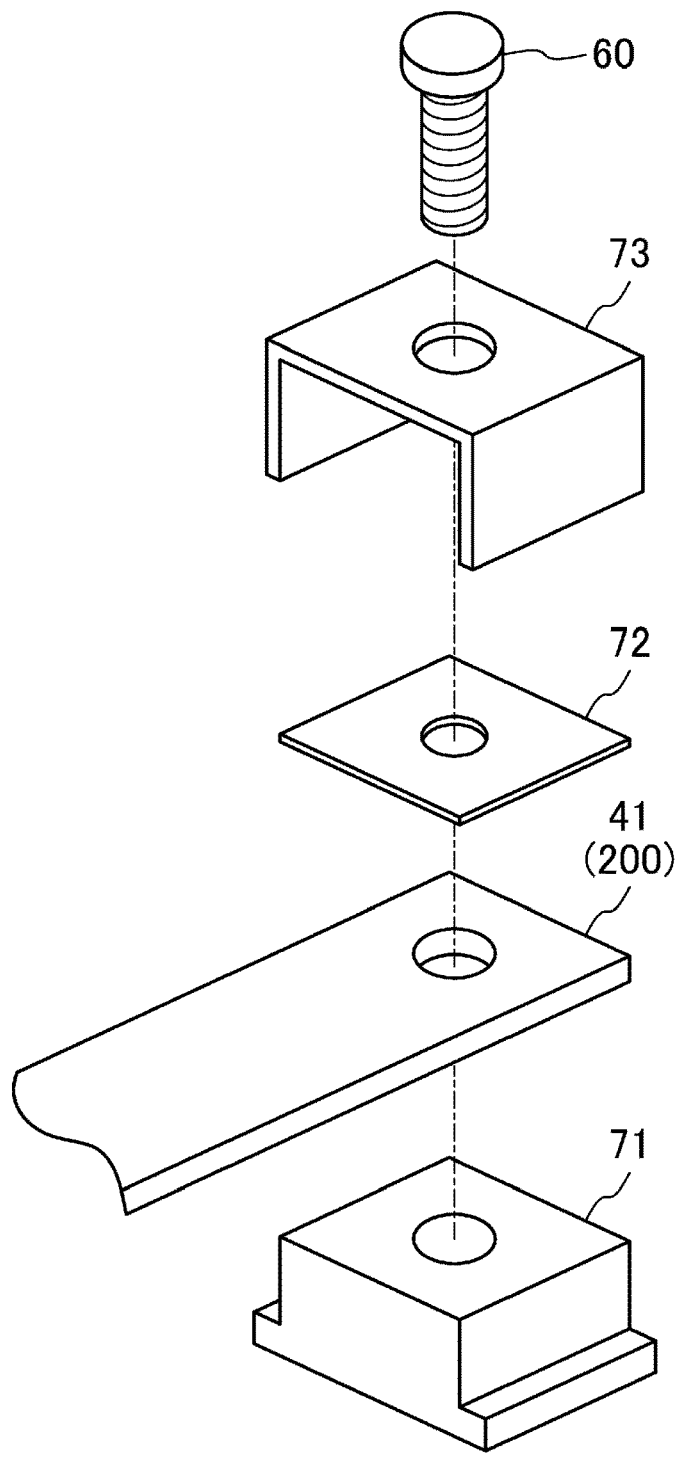
FIG. 8 is an exploded perspective view illustrating the third modification of the connection structure of the connection member.

FIGS. 7 and 8 each illustrate a third modification of the connection structure of connection member 200. In FIGS. 7 and 8, the connection structure of first power supply connection member 41 and third power supply region 403 is exemplified.

The connection structure of connection members 200 (first power supply connection member 41 in the example of FIGS. 7 and 8) is a structure in which connection members 200 are secured to substrate 20 (more specifically, conductive layer 22) by coupling screws 60. This connection structure includes mounts 71, insulating members 72, washers 73, and coupling screws 60.

Mounts 71, each of which is made of a conductive material (for example, metal), are provided on conductive layer 22. More specifically, mounts 71 are provided in connection parts between connection members 200 and conductive layer 22 (the connection parts correspond to parts to which connection members 200 are connected, namely, third power supply region 403 in the example of FIG. 7).

In this example, each of mounts 71 has a mounting surface (upper surface in FIG. 2) formed in a rectangular shape. Provided at a center of each mount 71 is an insertion hole through which corresponding coupling screw 60 passes. The insertion holes of mounts 71 have a larger diameter than an outer diameter of threaded portions of coupling screws 60.

Mounted on the mounting surface of each of mounts 71 is corresponding connection member 200. In this example, connection members 200, each of which is formed in a planar shape, are mounted on the mounting surfaces of mounts 71. Each connection member 200 is provided with an insertion hole through which corresponding coupling screw 60 passes. The insertion holes in connection members 200 have a larger diameter than an outer diameter of the threaded portions of coupling screws 60.

A height of mounts 71 (height from a surface of conductive layer 22 to the mounting surfaces of mounts 71) is greater than a height of high-side transistors 110 and low-side transistors 120 mounted on conductive layer 22 (height with reference to the surface of conductive layer 22). This configuration can prevent connection members 200 mounted on the mounting surfaces of mounts 71 from making contact with high-side transistors 110 and low-side transistors 120 provided in conductive layer 22.

Insulating members 72, each of which is formed in a planar shape, are mounted on connection members 200, which are mounted on mounts 71. For example, each of insulating members 72 may be made of an insulating paper (high-quality paper or craft paper coated with an insulating varnish). In this example, insulating members 72 are formed in conformity with a planar shape of the mounting surfaces of mounts 71 (namely, formed in a rectangular planar shape). Provided at a center of each insulating member 72 is an insertion hole through which corresponding coupling screw 60 passes. A diameter of the insertion holes in insulating members 72 is larger than the outer diameters of the threaded portions of coupling screws 60 but smaller than the diameter of the insertion holes in connection member 200 and mount 71. Each insulating member 72 is provided with annular projection 72a on its inner circumferential portion, which is positioned around the insertion hole. For example, each annular projection 72a may be formed by embossing the inner circumferential portion of corresponding insulating member 72 which is positioned around the insertion hole.

Washers 73, each of which is formed in a planar shape, are mounted on insulating members 72, which are mounted on connection members 200. In this example, each washer 73 is formed in a planar, U shape (a plate shape bent in a U shape). Each washer 73 is configured to cover corresponding mount 71, with connection member 200 and insulating member 72 being disposed between washer 73 and the mounting surface of mount 71. Provided at a center of each washer 73 is an insertion hole through which corresponding coupling screw 60 passes. The insertion holes in washers 73 have a larger diameter than the outer diameter of the threaded portions of coupling screws 60.

Conductive layer 22 and insulating layer 21 in substrate 20 are provided with insertion holes through which coupling screws 60 pass. A diameter of the insertion holes in conductive layer 22 and insulating layer 21 is larger than any of the outer diameter of the threaded portions of coupling screws 60 and the diameter of the insertion holes in insulating member 72. Provided in heat dissipation layer 23 of substrate 20 are threaded holes 61 into which coupling screws 60 are inserted.

Coupling screws 60 penetrate washers 73, insulating members 72, connection members 200, mounts 71, conductive layer 22, and insulating layer 21 and are fixed to heat dissipation layer 23. More specifically, coupling screws 60 pass through the insertion holes in washers 73, insulating members 72, connection members 200, mounts 71, conductive layer 22 and insulating layer 21 and are fixed to threaded hole 61 in heat dissipation layer 23. In this case, clearances are provided between the threaded portions of coupling screws 60 and the insertion holes in connection members 200, mounts 71, conductive layer 22, and insulating layer 21. In addition, washers 73 and insulating members 72 are provided between the heads of coupling screws 60 and connection members 200. This configuration reliably electrically insulates connection members 200 from heat dissipation layer 23.

As described above, by using coupling screws 60 that penetrate conductive layer 22 and insulating layer 21 and that are fixed to heat dissipation layer 23, connection members 200 are secured to the connection parts (third power supply region 403 in the example of FIG. 7) between connection members 200 and conductive layer 22 by screws. Contact between insulating layer 21 and heat dissipation layer 23 can be thereby improved. This configuration facilitates heat transmission from high-side transistors 110 and low-side transistors 120 to heat dissipation layer 23 via conductive layer 22 and insulating layer 21. As a result, the heat dissipation property of substrate 20 can be improved. Thus, the configuration can suppress a temperature rise caused by the switching operations of high-side transistors 110 and low-side transistors 120.

(Fourth Modification of Connection Structure of Connection Member)

Figure 9:
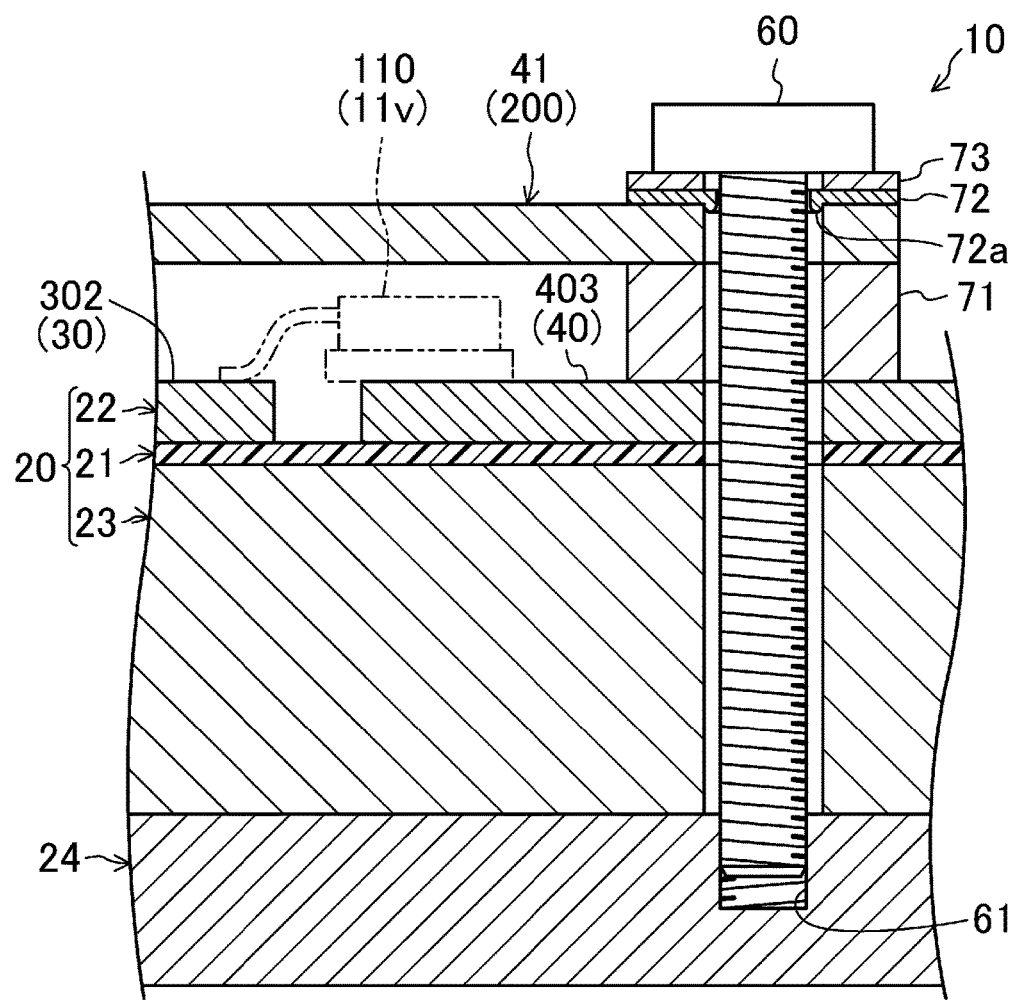
FIG. 9 is a cross-sectional view illustrating a fourth modification of the connection structure of the connection member.

FIG. 9 illustrates a fourth modification of a connection structure of connection member 200. In FIG. 9, the connection structure of first power supply connection member 41 and third power supply region 403 is exemplified.

As illustrated in FIG. 9, switching power supply device 10 may be configured such that coupling screws 60 penetrate conductive layer 22, insulating layer 21, and heat dissipation layer 23 and are fixed to heat dissipation member 24. More specifically, by using coupling screws 60 that penetrate conductive layer 22, insulating layer 21, and heat dissipation layer 23 and that are fixed to heat dissipation member 24, connection members 200 (first power supply connection member 41 in the example of FIG. 9) may be secured to connection parts (third power supply region 403 in the example of FIG. 9) between connection members 200 and conductive layer 22.

In the example of FIG. 9, each of conductive layer 22, insulating layer 21, and heat dissipation layer 23 is provided with insertion holes through which coupling screws 60 pass. Heat dissipation member 24 is provided with threaded holes 61 into which coupling screws 60 are inserted. Coupling screws 60 pass through insertion holes in washers 73, insulating members 72, connection members 200, mounts 71, conductive layer 22, insulating layer 21, and heat dissipation layer 23. Furthermore, coupling screws 60 are inserted into and fixed to threaded holes 61 in heat dissipation member 24. In this case, clearances are provided between the threaded portions of coupling screws 60 and the insertion holes in connection members 200, mounts 71, conductive layer 22, insulating layer 21, and heat dissipation layer 23. In addition, washers 73 and insulating members 72 are provided between the heads of coupling screws 60 and connection members 200. This configuration reliably electrically insulates connection members 200 from heat dissipation member 24.

As described above, by using coupling screws 60 that penetrate conductive layer 22, insulating layer 21, and heat dissipation layer 23 and that are fixed to heat dissipation member 24, connection members 200 are secured to the connection parts (third power supply region 403 in the example of FIG. 9) between connection members 200 and conductive layer 22. Contact between insulating layer 21 and heat dissipation layer 23 and between heat dissipation layer 23 and heat dissipation member 24 can be thereby improved. This configuration facilitates heat transmission from high-side transistors 110 and low-side transistors 120 to heat dissipation member 24 via conductive layer 22, insulating layer 21, and heat dissipation layer 23. As a result, the heat dissipation property of substrate 20 can be improved. Thus, the configuration can suppress a temperature rise caused by the switching operations of high-side transistors 110 and low-side transistors 120.

Moreover, by using coupling screws 60 that penetrate conductive layer 22, insulating layer 21, and heat dissipation layer 23 and that are fixed to heat dissipation member 24, connection members 200 are secured to the connection parts (third power supply region 403 in the example of FIG. 9) between connection members 200 and conductive layer 22. Warping of substrate 20 can be thereby suppressed. The configuration in which substrate 20 and heat dissipation member 24 are mutually secured via coupling screws 60 can reduce the number of components in switching power supply device 10.

Second Exemplary Embodiment

Figure 10:
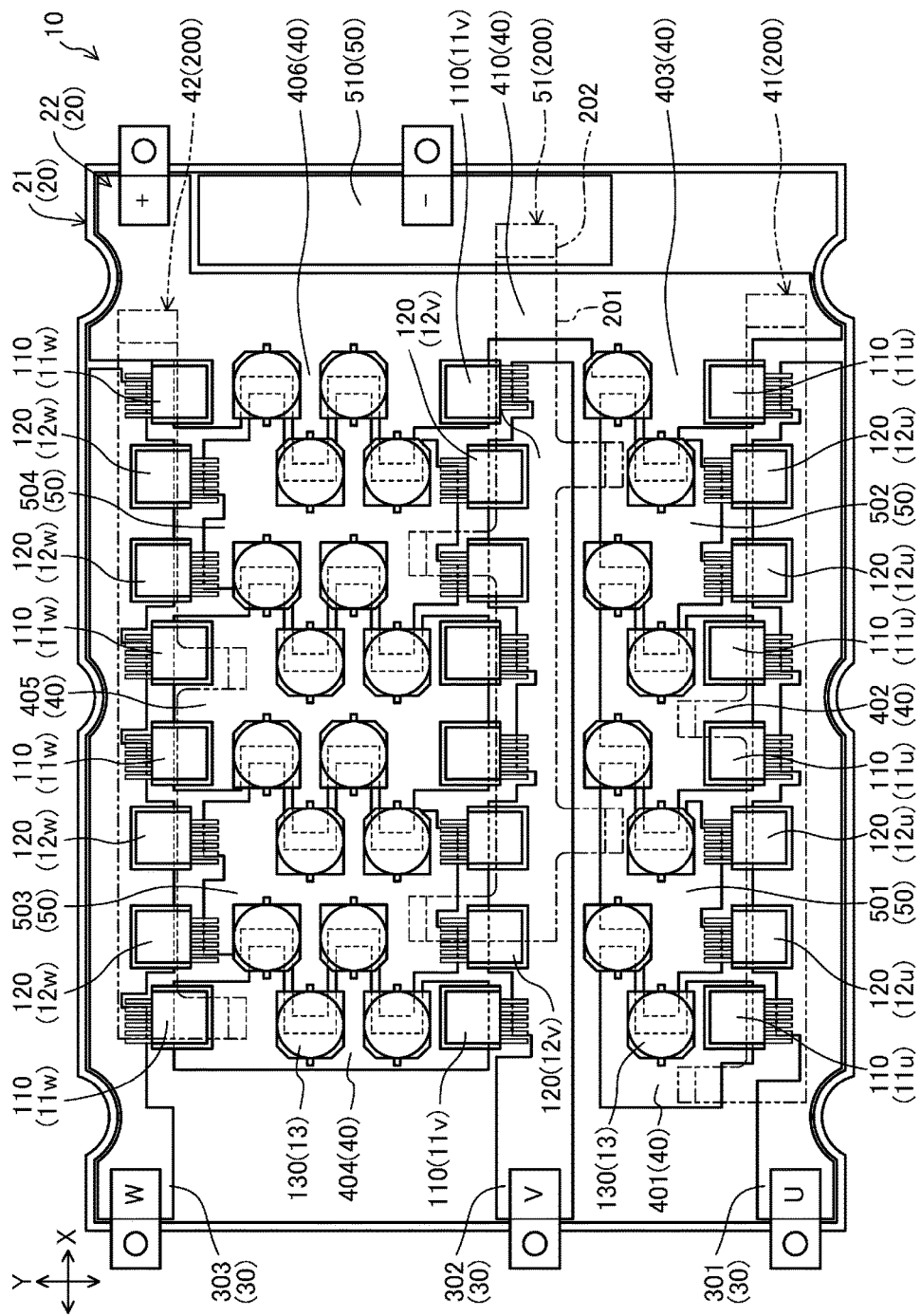
FIG. 10 is a plan view illustrating a configuration of a switching power supply device according to a second exemplary embodiment.

FIG. 10 illustrates a structure of switching power supply device 10 according to a second exemplary embodiment. Switching power supply device 10 according to the second exemplary embodiment differs from switching power supply device 10 according to the first exemplary embodiment, in configurations of power supply pattern 40, ground pattern 50, and connection members 200 and arrangements of high-side transistors 110, low-side transistors 120, and capacitors 130.

<Power Supply Pattern>

In the second exemplary embodiment, power supply pattern 40 includes: six wiring regions (first power supply region 401 to sixth power supply region 406); and power supply interconnection region 410.

<<Power Supply Region>>

The second exemplary embodiment is similar to the first exemplary embodiment in that the plurality of power supply regions 400 are arrayed spaced apart in an extending direction of output regions 300, and face corresponding output regions 300 with predetermined clearances therebetween in a direction orthogonal to the extending direction of output regions 300. More specifically, first power supply region 401 to sixth power supply region 406 have configurations described below.

First power supply region 401 to third power supply region 403 are disposed between first output region 301 and second output region 302, and arrayed spaced apart in an extending direction (first direction X) of first output region 301. In this example, first power supply region 401, second power supply region 402, and third power supply region 403 are arranged in this order from one end side to the other end side (the left side to the right side in FIG. 10) in the extending direction of first output region 301. First power supply region 401 to third power supply region 403 face first output region 301 with a predetermined clearance therebetween in the direction (second direction Y) orthogonal to the extending direction of first output region 301.

Fourth power supply region 404 to sixth power supply region 406 are disposed between second output region 302 and third output region 303, and arrayed spaced apart in an extending direction (first direction X) of second output region 302 and the third output region 303. In this example, fourth power supply region 404, fifth power supply region 405, and sixth power supply region 406 are arranged in this order from one end side to the other end side (the left side to the right side in FIG. 10) in the extending direction of second output region 302 and third output region 303. Fourth power supply region 404 to sixth power supply region 406 face second output region 302 with a predetermined clearance therebetween in a direction (second direction Y) orthogonal to the extending direction of second output region 302. In addition, fourth power supply region 404 to sixth power supply region 406 face third output region 303 with a predetermined clearance therebetween in a direction (second direction Y) orthogonal to an extending direction of third output region 303.

<<Power Supply Interconnection Region>>

In the second exemplary embodiment, power supply interconnection region 410 is formed so as to extend in second direction Y, which is along a lateral direction of substrate 20, and disposed near an edge part (right edge part in FIG. 10) of substrate 20 in the longitudinal direction. Third power supply region 403 and sixth power supply region 406 are connected to power supply interconnection region 410. In the second exemplary embodiment, first power supply region 401, second power supply region 402, fourth power supply region 404, and fifth power supply region 405 are electrically connected to power supply interconnection region 410 via connection members 200 (first power supply connection member 41 and second power supply connection member 42) that will be described later.

<Ground Pattern>

In the second exemplary embodiment, ground pattern 50 includes four wiring regions (first ground region 501 to fourth ground region 504) and ground interconnection region 510.

<<Ground Region>>

The second exemplary embodiment is similar to the first exemplary embodiment in that the plurality of ground regions 500 are arrayed spaced apart in the extending direction of output regions 300, and face corresponding output regions 300 with predetermined clearances therebetween in a direction orthogonal to the extending direction of output regions 300. More specifically, first ground region 501 to fourth ground region 504 have configurations described below.

Both first ground region 501 and second ground region 502 are disposed between first output region 301 and second output region 302, and arrayed spaced apart in the extending direction (first direction X) of first output region 301. In this example, first ground region 501 and second ground region 502 are arranged in this order from one end side to the other end side (the left side to the right side in FIG. 10) in the extending direction of first output region 301. In addition, both first ground region 501 and second ground region 502 face first output region 301 with a predetermined clearance therebetween in the direction (second direction Y) orthogonal to the extending direction of first output region 301.

Both third ground region 503 and fourth ground region 504 are disposed between first output region 301 and second output region 302, and arrayed spaced apart in an extending direction (first direction X) of second output region 302 and third output region 303. In this example, third ground region 503 and fourth ground region 504 are arranged in this order from one end side to the other end side (the left side to the right side in FIG. 10) in the extending direction of second output region 302 and third output region 303. In addition, both third ground region 503 and fourth ground region 504 face second output region 302 with a predetermined clearance therebetween in the direction (second direction Y) orthogonal to the extending direction of second output region 302. Likewise, both third ground region 503 and fourth ground region 504 face third output region 303 with a predetermined clearance therebetween in the direction (second direction Y) orthogonal to the extending direction of third output region 303.

<<Ground Interconnection Region>>

In the second exemplary embodiment, ground interconnection region 510 is disposed near an edge part (right edge part in FIG. 10) of substrate 20 in the longitudinal direction. In the second exemplary embodiment, first ground region 501 to fourth ground region 504 are electrically connected to ground interconnection region 510 via connection member 200 (ground connection member 51) that will be described later.

<Arrangement of Power Supply Regions and Ground Regions>

The second exemplary embodiment is similar to the first exemplary embodiment in that the plurality of power supply regions 400 and the plurality of ground regions 500 are alternately arrayed in the direction along the extending direction of output regions 300. Furthermore, the plurality of power supply regions 400 and the plurality of ground regions 500 are arrayed such that each power supply region 400 and its adjacent ground region 500 face each other with a predetermined clearance therebetween.

More specifically, between first output region 301 and second output region 302, first power supply region 401, first ground region 501, second power supply region 402, second ground region 502, and third power supply region 403 are arranged in this order from one side to the other side (the left side to the right side in FIG. 10) in first direction X, which is along the extending direction of first output region 301. First ground region 501 faces both first power supply region 401 and second power supply region 402 with a predetermined clearance therebetween. Likewise, second ground region 502 faces both second power supply region 402 and third power supply region 403 with a predetermined clearance therebetween.

Between second output region 302 and third output region 303, fourth power supply region 404, third ground region 503, fifth power supply region 405, fourth ground region 504, and sixth power supply region 406 are arranged in this order from one side to the other side (the left side to the right side in FIG. 10) in first direction X, which is along the extending direction of second output region 302 and third output region 303. Third ground region 503 faces both fourth power supply region 404 and fifth power supply region 405 with a predetermined clearance therebetween. Likewise, fourth ground region 504 faces both fifth power supply region 405 and sixth power supply region 406 with a predetermined clearance therebetween.

<High-Side Switching Element and High-Side Transistor>

The second exemplary embodiment is similar to the first exemplary embodiment in that conductive layer 22 of substrate 20 is provided with first high-side switching element 11u to third high-side switching element 11w. Each of first high-side switching element 11u to third high-side switching element 11w includes four high-side transistors 110.

Four high-side transistors 110 constituting first high-side switching element 11u are disposed spaced apart in first direction X, which is along the extending direction of first output region 301. Out of these four high-side transistors 110, one high-side transistor 110 is mounted on a surface of first power supply region 401 and connected to first output region 301; two high-side transistors 110 are mounted on a surface of second power supply region 402 and connected to first output region 301; and one remaining high-side transistor 110 is mounted on a surface of third power supply region 403 and connected to first output region 301.

Four high-side transistors 110 constituting second high-side switching element 11v are disposed spaced apart in first direction X, which is along the extending direction of second output region 302. Out of these four high-side transistors 110, one high-side transistor 110 is mounted on a surface of fourth power supply region 404 and connected to second output region 302; two high-side transistors 110 are mounted on a surface of fifth power supply region 405 and connected to second output region 302; and one remaining high-side transistor 110 is mounted on a surface of sixth power supply region 406 and connected to second output region 302.

Four high-side transistors 110 constituting third high-side switching element 11w are disposed spaced apart in first direction X, which is along the extending direction of third output region 303. Out of these four high-side transistors 110, one high-side transistor 110 is mounted on the surface of fourth power supply region 404 and connected to third output region 303; two high-side transistors 110 are mounted on the surface of fifth power supply region 405 and connected to third output region 303; and one remaining high-side transistor 110 is mounted on the surface of sixth power supply region 406 and connected to third output region 303.

<Low-Side Switching Element and Low-Side Transistor>

The second exemplary embodiment is similar to the first exemplary embodiment in that conductive layer 22 of substrate 20 is provided with first low-side switching element 12u to third low-side switching element 12w. Each of first low-side switching element 12u to third low-side switching element 12w includes four low-side transistors 120.

Four low-side transistors 120 constituting first low-side switching element 12u are disposed spaced apart in first direction X, which is along the extending direction of first output region 301. Out of these four low-side transistors 120, two low-side transistors 120 are mounted on a surface of first output region 301 and connected to first ground region 501, and two remaining low-side transistors 120 are mounted on the surface of first output region 301 and connected to second ground region 502.

Four low-side transistors 120 constituting second low-side switching element 12v are disposed spaced apart in first direction X, which is along the extending direction of second output region 302. Out of these four low-side transistors 120, two low-side transistors 120 are mounted on a surface of second output region 302 and connected to third ground region 503, and two remaining low-side transistors 120 are mounted on the surface of second output region 302 and connected to fourth ground region 504.

Four low-side transistors 120 constituting third low-side switching element 12w are disposed spaced apart in first direction X, which is along the extending direction of third output region 303. Out of these four low-side transistors 120, two low-side transistors 120 are mounted on a surface of third output region 303 and connected to third ground region 503, and two remaining low-side transistors 120 are mounted on the surface of third output region 303 and connected to fourth ground region 504.

<Arrangement of High-Side Transistors and Low-Side Transistors>

The second exemplary embodiment is similar to the first exemplary embodiment in that the plurality of high-side transistors 110 that constitute single high-side switching element 11 are arranged, one by one, next to the plurality of low-side transistors 120 that constitute single low-side switching element 12 in first direction X, which is along the extending direction of output regions 300. In this case, a direction in which terminals of low-side transistors 120 (terminals protruding from sides of main bodies to ground regions 500) are oriented is opposite to a direction in which terminals of high-side transistor 110 (terminals protruding from sides of main bodies to output regions 300) are orientated.

More specifically, the four high-side transistors 110 that constitute first high-side switching element 11u and the four low-side transistors 120 that constitute first low-side switching element 12u are arrayed in first direction X, which is along the extending direction of first output region 301 such that one high-side transistor 110, two low-side transistors 120, two high-side transistors 110, two low-side transistors 120, and one high-side transistor 110 are arranged in this order from one side to the other side (the left side to the right side in FIG. 10) in first direction X.

The four high-side transistors 110 that constitute second high-side switching element 11v and the four low-side transistors 120 that constitute second low-side switching element 12v are arrayed in first direction X, which is along the extending direction of second output region 302 such that one high-side transistor 110, two low-side transistors 120, two high-side transistors 110, two low-side transistors 120, and one high-side transistor 110 are arranged in this order from one side to the other side (the left side to the right side in FIG. 10) in first direction X.

The four high-side transistors 110 that constitute third high-side switching element 11w and the four low-side transistors 120 that constitute third low-side switching element 12w are arrayed in first direction X, which is along the extending direction of third output region 303 such that one high-side transistor 110, two low-side transistors 120, two high-side transistors 110, two low-side transistors 120, and one high-side transistor 110 are arranged in this order from one side to the other side (the left side to the right side in FIG. 10) in first direction X.

<Smoothing Capacitor Section and Capacitor>

The switching power supply device 10 according to the second exemplary embodiment is similar to switching power supply device 10 according to the first exemplary embodiment, in that conductive layer 22 of substrate 20 is provided with smoothing capacitor section 13. Smoothing capacitor section 13 includes a plurality of capacitors 130.

The second exemplary embodiment is similar to the first exemplary embodiment in that the plurality of capacitors 130 correspond to the plurality of high-side transistors 110 and the plurality of low-side transistors 120. Each of the plurality of capacitors 130 is disposed next to its corresponding transistor of the plurality of high-side transistors 110 and the plurality of low-side transistors 120. In other words, the plurality of high-side transistors 110, the plurality of low-side transistors 120, and the plurality of capacitors 130 are disposed such that pairs each including high-side transistor 110 and its corresponding capacitor 130 are positioned next to pairs each including low-side transistor 120 and its corresponding capacitor 130.

More specifically, the second exemplary embodiment is similar to the first exemplary embodiment in that 24 capacitors 130 are provided, which correspond to 12 high-side transistors 110 and 12 low-side transistors 120 provided in conductive layer 22 of substrate 20.

Four capacitors 130 corresponding to respective four high-side transistors 110 constituting first high-side switching element 11$u$ are disposed spaced apart in first direction X, which is along the array direction of these four high-side transistors 110 (extending direction of first output region 301), and are provided near the four high-side transistors 110. Out of these four capacitors 130, one capacitor 130 is mounted on the surface of first power supply region 401 and a surface of first ground region 501; one capacitor 130 is mounted on the surfaces of second power supply region 402 and first ground region 501; one capacitor 130 is mounted on the surface of second power supply region 402 and a surface of second ground region 502; and one remaining capacitor 130 is mounted on the surfaces of third power supply region 403 and second ground region 502.

Four capacitors 130 corresponding to respective four high-side transistors 110 constituting second high-side switching element 11$v$ are disposed spaced apart in first direction X, which is along the array direction of these four high-side transistors 110 (extending direction of second output region 302), and are provided near the four high-side transistors 110. Out of these four capacitors 130, one capacitor 130 is mounted on the surface of fourth power supply region 404 and a surface of third ground region 503; one capacitor 130 is mounted on the surfaces of fifth power supply region 405 and third ground region 503; one capacitor 130 is mounted on the surface of fifth power supply region 405 and a surface of fourth ground region 504; and one remaining capacitor 130 is mounted on the surfaces of sixth power supply region 406 and fourth ground region 504.

Four capacitors 130 corresponding to respective four high-side transistors 110 constituting third high-side switching element 11$w$ are disposed spaced apart in first direction X, which is along the array direction of these four high-side transistors 110 (extending direction of third output region 303), and are provided near the four high-side transistors 110. Out of these four capacitors 130, one capacitor 130 is mounted on the surface of fourth power supply region 404 and a surface of third ground region 503; one capacitor 130 is mounted on the surfaces of fifth power supply region 405 and third ground region 503; one capacitor 130 is mounted on the surface of fifth power supply region 405 and a surface of fourth ground region 504; and one remaining capacitor 130 is mounted on the surfaces of sixth power supply region 406 and fourth ground region 504.

Four capacitors 130 corresponding to respective four low-side transistors 120 constituting first low-side switching element 12$u$ are disposed spaced apart in first direction X, which is along the array direction of these four low-side transistors 120 (extending direction of first output region 301), and are provided near the four low-side transistors 120. Out of these four capacitors 130, one capacitor 130 is mounted on the surface of first power supply region 401 and a surface of first ground region 501; one capacitor 130 is mounted on the surfaces of second power supply region 402 and first ground region 501; one capacitor 130 is mounted on the surface of second power supply region 402 and a surface of second ground region 502; and one remaining capacitor 130 is mounted on the surfaces of third power supply region 403 and second ground region 502.

Four capacitors 130 corresponding to respective four low-side transistors 120 constituting second low-side switching element 12$v$ are disposed spaced apart in first direction X, which is along the array direction of these four low-side transistors 120 (extending direction of second output region 302), and are provided near the four low-side transistors 120. Out of these four capacitors 130, one capacitor 130 is mounted on the surface of fourth power supply region 404 and a surface of third ground region 503; one capacitor 130 is mounted on the surfaces of fifth power supply region 405 and third ground region 503; one capacitor 130 is mounted on the surface of fifth power supply region 405 and a surface of fourth ground region 504; and one remaining capacitor 130 is mounted on the surfaces of sixth power supply region 406 and fourth ground region 504.

Four capacitors 130 corresponding to respective four low-side transistors 120 constituting third low-side switching element 12$w$ are disposed spaced apart in first direction X, which is along the array direction of these four low-side transistors 120 (extending direction of third output region 303), and are provided near the four low-side transistors 120. Out of these four capacitors 130, one capacitor 130 is mounted on the surface of fourth power supply region 404 and a surface of third ground region 503; one capacitor 130 is mounted on the surfaces of fifth power supply region 405 and third ground region 503; one capacitor 130 is mounted on the surface of fifth power supply region 405 and a surface of fourth ground region 504; and one remaining capacitor 130 is mounted on the surfaces of sixth power supply region 406 and fourth ground region 504.

<Connection Member>

The second exemplary embodiment is similar to the first exemplary embodiment in that at least one of power supply pattern 40 and ground pattern 50 has a plurality of wiring regions (portions of the wire patterns formed in conductive layer 22) electrically connected via connection members 200. In this example, power supply pattern 40 has first power supply region 401, second power supply region 402, fourth power supply region 404, and fifth power supply region 405 electrically connected via first power supply connection member 41 and second power supply connection member 42 (connection members 200). Ground pattern 50 has first ground region 501 to fourth ground region 504 electrically connected via ground connection member 51 (connection member 200). FIG. 10 illustrates first power supply connection member 41, second power supply connection member 42, and ground connection member 51 with alternate long and two short dashes lines.

First power supply connection member 41 electrically connects power supply interconnection region 410, first power supply region 401, and second power supply region 402. Second power supply connection member 42 electrically connects power supply interconnection region 410, fourth power supply region 404, and fifth power supply region 405. Ground connection member 51 electrically connects ground interconnection region 510, first ground region 501, second ground region 502, third ground region 503, and fourth ground region 504.

The second exemplary embodiment is similar to the first exemplary embodiment in that each of connection members 200 is made of a conductor (bus bar) having a planar shape. More specifically, each connection member 200 has main body 201 and extending parts 202; main body 201 is formed in a planar shape and faces conductive layer 22 with a distance therebetween; and each of extending parts 202 extends from main body 201 to any one of the plurality of wiring regions in conductive layer 22. For example, ground connection member 51 has main body 201 and five extending parts 202; main body 201 faces second output region 302 with a distance therebetween, and extending parts 202 extend from main body 201 to respective five wiring regions (ground interconnection region 510, first ground region 501, second ground region 502, third ground region 503, and fourth ground region 504) of ground pattern 50.

The second exemplary embodiment is similar to the first exemplary embodiment in that connection members 200 are bonded to the plurality of wiring regions in conductive layer 22 with soldering. For example, five extending parts 202 of ground connection member 51 are bonded, with soldering, to the respective five wiring regions (ground interconnection region 510, first ground region 501, second ground region 502, third ground region 503, and fourth ground region 504) of ground pattern 50.

The second exemplary embodiment is similar to the first exemplary embodiment in that a material of connection members 200 may be of the same type as a type of a material of heat dissipation layer 23. In this example, portions of each connection member 200 which are bonded to the plurality of wiring regions with soldering may be subjected to plate processing, in order to enable solder bonding. For example, each of ground connection member 51 and heat dissipation layer 23 may be made of aluminum. In ground connection member 51, five extending parts 202 that are bonded, with soldering, to the five wiring regions (ground interconnection region 510, first ground region 501, second ground region 502, third ground region 503, and fourth ground region 504) of ground pattern 50 are plated with nickel (material that enables solder bonding).

[Effect of Second Exemplary Embodiment]

Switching power supply device 10 according to the second exemplary embodiment can produce substantially the same effect as the effect of switching power supply devices 10 according to the first exemplary embodiment. For example, it is possible to reduce heat concentration in high-side switching elements 11 and low-side switching elements 12.

Third Exemplary Embodiment

Figure 11:
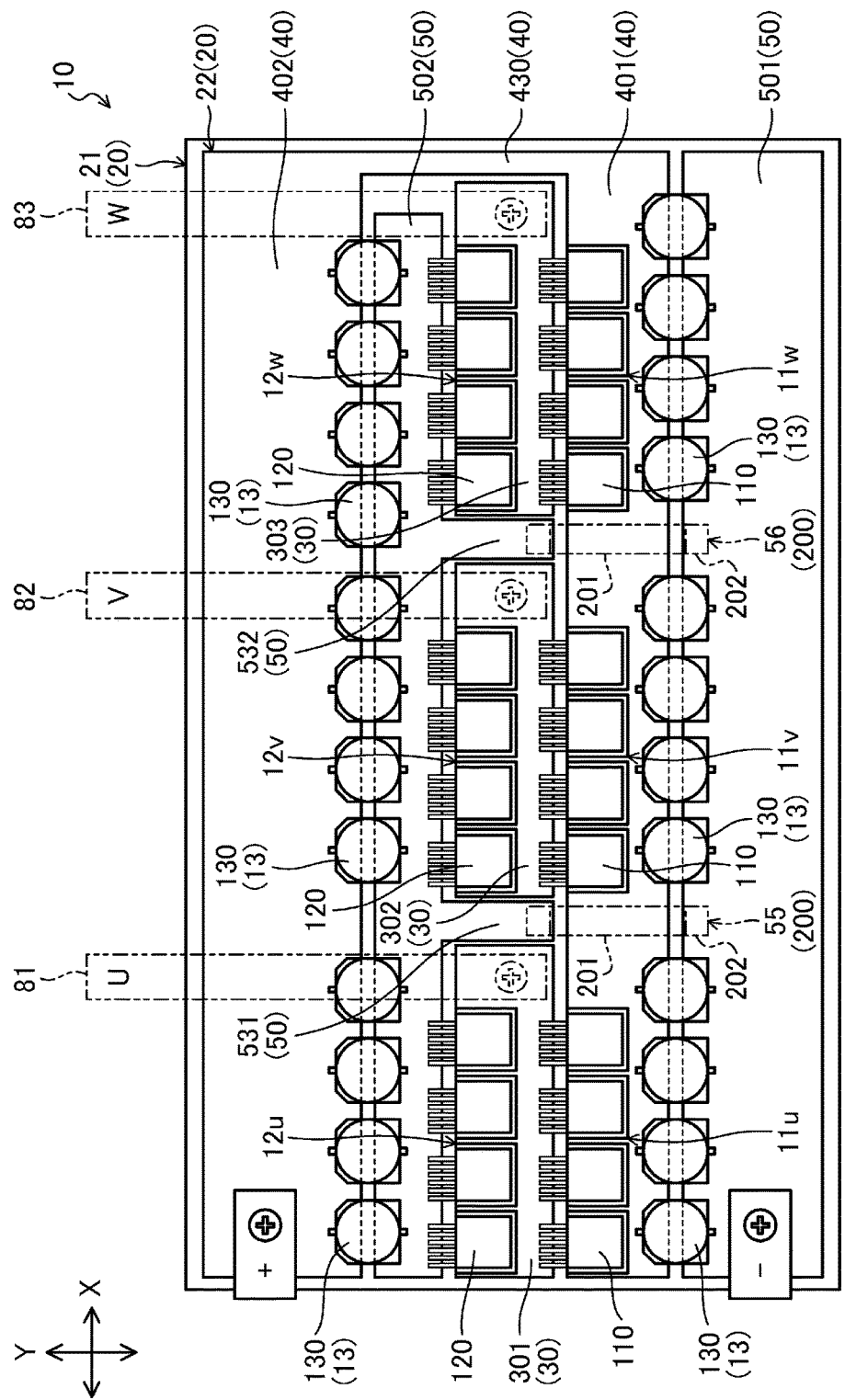
FIG. 11 is a plan view illustrating a configuration of a switching power supply device according to a third exemplary embodiment.

FIG. 11 illustrates a configuration of switching power supply device 10 according to a third exemplary embodiment. Switching power supply device 10 according to the third exemplary embodiment differs from switching power supply device 10 according to the first exemplary embodiment, in configurations of output pattern 30, power supply pattern 40, ground pattern 50, and connection members 200 and arrangements of high-side transistors 110, low-side transistors 120, and capacitors 130.

<Output Pattern>

In the third exemplary embodiment, output pattern 30 includes first output region 301 to third output region 303, which correspond to first switching section SWu to third switching section SWw, respectively. First output region 301 to third output region 303 are formed so as to extend in first direction X, and disposed spaced apart in first direction X. In this example, first output region 301 to third output region 303 are disposed in a middle of substrate 20 in its lateral direction.

First output region 301 to third output region 303 are electrically connected to first output connection member 81 to third output connection member 83. For example, each of first output connection member 81 to third output connection member 83 may be formed of a conductor (bus bar) having a planar shape. FIG. 11 illustrates first output connection member 81 to third output connection member 83 with alternate long and two short dashes lines.

<Power Supply Pattern>

In the third exemplary embodiment, power supply pattern 40 includes first power supply region 401, second power supply region 402, and power supply connection region 430.

<<Power Supply Region>>

First power supply region 401 and second power supply region 402 extend in an extending direction (first direction X) of first output region 301 to third output region 303. First power supply region 401 faces first output region 301 to third output region 303 with a predetermined distance therebetween in a direction (second direction Y) orthogonal to the extending direction of first output region 301 to third output region 303. Second power supply region 402 is disposed so as to face first power supply region 401 with first output region 301 to third output region 303 and second ground region 502, which will be described later, therebetween in the direction (second direction Y) orthogonal to the extending direction of first output region 301 to third output region 303. In addition, second power supply region 402 is electrically connected to an end (positive electrode) of DC power supply P.

<<Power Supply Connection Region>>

Power supply connection region 430 is formed so as to extend in second direction Y and connects first power supply region 401 to second power supply region 402. In this example, power supply connection region 430 is disposed near an edge part (right edge part in FIG. 11) of substrate 20 in the longitudinal direction.

<Ground Pattern>

In the third exemplary embodiment, ground pattern 50 includes first ground region 501, second ground region 502, first ground extension region 531, and second ground extension region 532.

<<Ground Region>>

First ground region 501 and second ground region 502 extend in an extending direction (first direction X) of first output region 301 to third output region 303. In addition, second ground region 502 faces first output region 301 to third output region 303 with a predetermined distance therebetween in the direction (second direction Y) orthogonal to the extending direction of first output region 301 to third output region 303. First ground region 501 is disposed so as to face second ground region 502 with first power supply region 401 and first output region 301 to third output region 303 therebetween in the direction (second direction Y) orthogonal to the extending direction of first output region 301 to third output region 303. In addition, first ground region 501 is electrically connected to the other end (negative electrode) of DC power supply P.

<<Ground Extension Region>>

First ground extension region 531 and second ground extension region 532 are formed so as to extend in the direction (second direction Y) orthogonal to the extending direction of first output region 301 to third output region 303. First ground extension region 531 is disposed between first output region 301 and second output region 302, whereas second ground extension region 532 is disposed between second output region 302 and third output region 303. In addition, both first ground extension region 531 and second ground extension region 532 are connected to second ground region 502 while facing first power supply region 401 with a predetermined distance therebetween.

<Arrangement of Power Supply Regions and Ground Regions>

In the third exemplary embodiment, a plurality of power supply regions 400 and a plurality of ground regions 500 are disposed so as to face each other with a predetermined distance in a direction orthogonal to an extending direction of output regions 300.

More specifically, first ground region 501, first power supply region 401, first output region 301 to third output region 303, second ground region 502, and second power supply region 402 are arranged in this order from one end side to the other end side (a lower side to an upper side in the example of FIG. 11) in the lateral direction of substrate 20. In addition, first power supply region 401 faces first ground region 501 with a predetermined distance therebetween, whereas second power supply region 402 faces second ground region 502 with a predetermined distance therebetween.

<High-Side Switching Element and High-Side Transistor>

The third exemplary embodiment is similar to the first exemplary embodiment in that conductive layer 22 of substrate 20 is provided with first high-side switching element 11u to third high-side switching element 11w. Each of first high-side switching element 11u to third high-side switching element 11w includes four high-side transistors 110.

The four high-side transistors 110 that constitute first high-side switching element 11u are disposed spaced apart in first direction X, which is along the extending direction of first output region 301. These high-side transistors 110 are mounted on a surface of first power supply region 401 and connected to first output region 301. The four high-side transistors 110 that constitute second high-side switching element 11v are disposed spaced apart in first direction X, which is along the extending direction of second output region 302. These high-side transistors 110 are mounted on the surface of first power supply region 401 and connected to second output region 302. The four high-side transistors 110 that constitute third high-side switching element 11w are disposed spaced apart in first direction X, which is along the extending direction of third output region 303. These high-side transistors 110 are mounted on the surface of first power supply region 401 and connected to third output region 303.

<Low-Side Switching Element and Low-Side Transistor>

The third exemplary embodiment is similar to the first exemplary embodiment in that conductive layer 22 of substrate 20 is provided with first low-side switching element 12u to third low-side switching element 12w. Each of first low-side switching element 12u to third low-side switching element 12w includes four low-side transistors 120.

The four low-side transistors 120 that constitute first low-side switching element 12u are disposed spaced apart in first direction X, which is along the extending direction of first output region 301. These low-side transistors 120 are mounted on a surface of first output region 301 and connected to second ground region 502. The four low-side transistors 120 that constitute second low-side switching element 12v are disposed spaced apart in first direction X, which is along the extending direction of second output region 302. These low-side transistors 120 are mounted on a surface of second output region 302 and connected to second ground region 502. The four low-side transistors 120 that constitute third low-side switching element 12w are disposed spaced apart in first direction X, which is along the extending direction of third output region 303. These low-side transistors 120 are mounted on a surface of third output region 303 and connected to second ground region 502.

<Arrangement of High-Side Transistors and Low-Side Transistors>

In the third exemplary embodiment, the plurality of high-side transistors 110 that constitute single high-side switching element 11 and the plurality of low-side transistors 120 that constitute single low-side switching element 12 are arranged in the direction (first direction X) along the extending direction of output regions 300 such that one high-side transistor 110 is disposed next to one corresponding low-side transistor 120 in the direction (second direction Y) orthogonal to the extending direction of output regions 300.

More specifically, the four high-side transistors 110 that constitute first high-side switching element 11u face, one by one, the four low-side transistors 120 that constitute first low-side switching element 12u in second direction Y, which is orthogonal to the extending direction of first output region 301. Likewise, the four high-side transistors 110 that constitute second high-side switching element 11v faces, one by one, the four low-side transistors 120 that constitute second low-side switching element 12v in second direction Y, which is orthogonal to the extending direction of second output region 302. The four high-side transistors 110 that constitute third high-side switching element 11w faces, one by one, the four low-side transistors 120 that constitute third low-side switching element 12w in second direction Y, which is orthogonal to the extending direction of third output region 303.

<Smoothing Capacitor Section and Capacitor>

The switching power supply device 10 according to the third exemplary embodiment is similar to switching power supply device 10 according to the first exemplary embodiment, in that conductive layer 22 of substrate 20 is provided with smoothing capacitor section 13. Smoothing capacitor section 13 includes a plurality of capacitors 130.

The third exemplary embodiment is similar to the first exemplary embodiment in that the plurality of capacitors 130 correspond to the plurality of high-side transistors 110 and the plurality of low-side transistors 120. Each of the plurality of capacitors 130 is disposed next to its corresponding transistor of the plurality of high-side transistors 110 and the plurality of low-side transistors 120. In other words, the plurality of high-side transistors 110, the plurality of low-side transistors 120, and the plurality of capacitors 130 are disposed such that pairs each including high-side transistor 110 and its corresponding capacitor 130 are positioned next to pairs each including low-side transistor 120 and its corresponding capacitor 130.

In this example, the plurality of capacitors 130 corresponding to the plurality of high-side transistors 110 are disposed spaced apart in first direction X, which is along an array direction of the plurality of high-side transistors 110 (which is along the extending direction of output regions 300). In addition, these capacitors 130 are disposed next to the plurality of high-side transistors 110 in a direction (second direction Y) orthogonal to the array direction of the plurality of high-side transistors 110. The plurality of capacitors 130 corresponding to the plurality of low-side transistors 120 are disposed spaced apart in first direction X, which is along an array direction of the plurality of low-side transistor 120 (which is along the extending direction of output regions 300). In addition, these capacitors 130 are next to the plurality of low-side transistors 120 in the direction (second direction Y) orthogonal to the array direction of the plurality of low-side transistors 120. In this example, capacitors 130 corresponding to high-side transistors 110, high-side transistors 110, low-side transistors 120, and capacitors 130 corresponding to low-side transistors 120 are arranged in this order from one side to the other side (from the lower side to the upper side in FIG. 11) of substrate 20 in the lateral direction.

More specifically, four capacitors 130 that correspond to respective four high-side transistors 110 constituting first high-side switching element 11u are disposed spaced apart in first direction X, which is along the array direction of these four high-side transistors 110 (extending direction of first output region 301), and are provided near the four high-side transistors 110. The four capacitors 130 corresponding to respective four high-side transistors 110 are mounted on surfaces of first power supply region 401 and first ground region 501. A configuration of four capacitors 130 corresponding to respective four high-side transistors 110 constituting second high-side switching element 11v and a configuration of four capacitors 130 corresponding to respective four high-side transistors 110 constituting third high-side switching element 11w are the same as the configuration of four capacitors 130 corresponding to respective four high-side transistors 110 constituting first high-side switching element 11u.

Four capacitors 130 that correspond to respective four low-side transistors 120 constituting first low-side switching element 12u are disposed spaced apart in first direction X, which is along the array direction of these four low-side transistors 120 (which is along the extending direction of first output region 301), and are provided near the four low-side transistors 120. The four capacitors 130 corresponding to respective four low-side transistors 120 are mounted on surfaces of second power supply region 402 and second ground region 502. A configuration of four capacitors 130 corresponding to respective four low-side transistors 120 constituting second low-side switching element 12v and a configuration of four capacitors 130 corresponding to respective four low-side transistors 120 constituting third low-side switching element 12w are the same as the configuration of four capacitors 130 corresponding to respective four low-side transistors 120 constituting first low-side switching element 12u.

<Connection Member>

The third exemplary embodiment is similar to the first exemplary embodiment in that at least one of power supply pattern 40 and ground pattern 50 has a plurality of wiring regions (portions of the wire patterns formed in conductive layer 22) electrically connected via connection members 200. In this example, ground pattern 50 has first ground region 501, first ground extension region 531, and second ground extension region 532 electrically connected via first ground connection member 55 and second ground connection member 56 (connection members 200). FIG. 11 illustrates first ground connection member 55 and second ground connection member 56 with alternate long and two short dashes lines.

First ground connection member 55 electrically connect first ground region 501 to first ground extension region 531. Second ground connection member 56 electrically connect first ground region 501 to second ground extension region 532.

The third exemplary embodiment is similar to the first exemplary embodiment in that each of connection members 200 is made of a conductor (bus bar) having a planar shape. More specifically, each connection member 200 has main body 201 and extending parts 202; main body 201 is formed in a planar shape and faces conductive layer 22 with a distance therebetween; and each of extending parts 202 extends from main body 201 to any one of the plurality of wiring regions in conductive layer 22. For example, first ground connection member 55 has main body 201 and two extending parts 202; main body 201 faces first power supply region 401 with a distance therebetween, and extending parts 202 extend from main body 201 to respective two wiring regions (first ground region 501 and first ground extension region 531) of ground pattern 50.

The third exemplary embodiment is similar to the first exemplary embodiment in that connection members 200 are bonded to the plurality of wiring regions in conductive layer 22 with soldering. For example, two extending parts 202 of first ground connection member 55 are bonded, with soldering, to the respective two wiring regions (first ground region 501 and first ground extension region 531) of ground pattern 50.

The third exemplary embodiment is similar to the first exemplary embodiment in that a material of connection members 200 may be of the same type as a type of a material of heat dissipation layer 23. In this example, portions of each connection member 200 which are bonded to the plurality of wiring regions with soldering may be subjected to plate processing, in order to enable solder bonding. For example, each of first ground connection member 55 and heat dissipation layer 23 may be made of aluminum. In first ground connection member 55, two extending parts 202 that are bonded, with soldering, to the two wiring regions (first ground region 501 and first ground extension region 531) of ground pattern 50 are plated with nickel (material that enables solder bonding).

[Effect of Third Exemplary Embodiment]

Switching power supply device 10 according to the third exemplary embodiment can produce substantially the same effect as the effect of switching power supply device 10 according to the first exemplary embodiment. For example, it is possible to reduce heat concentration in high-side switching elements 11 and low-side switching elements 12.

(First Modification of Third Exemplary Embodiment)

Figure 12:
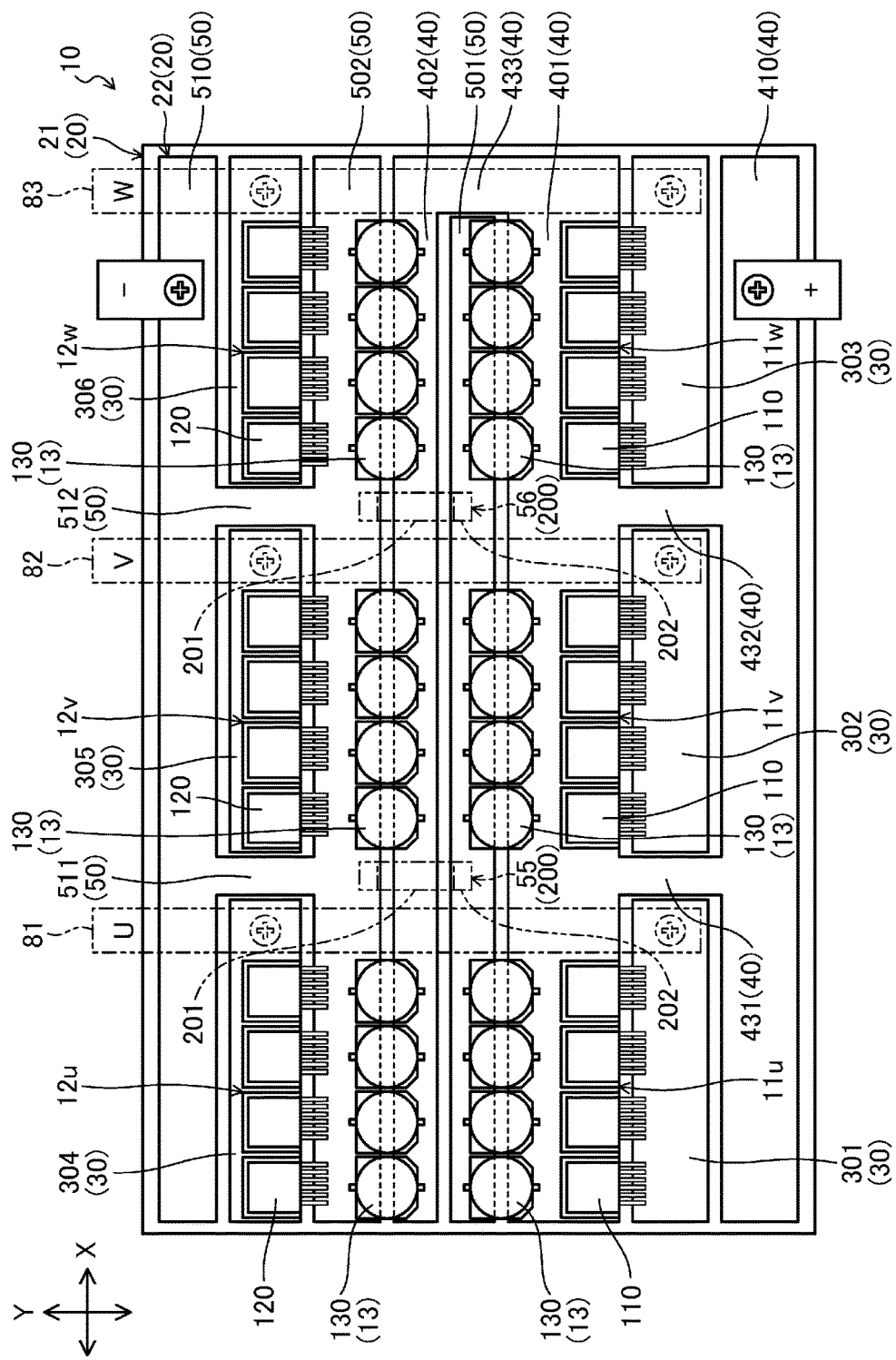
FIG. 12 is a plan view illustrating a configuration of a switching power supply device according to a first modification of the third exemplary embodiment.

FIG. 12 illustrates a configuration of switching power supply device 10 according to a first modification of the third exemplary embodiment. Switching power supply device 10 according to a first modification of the third exemplary embodiment differs from switching power supply device 10 according to the third exemplary embodiment, in configurations of output pattern 30, power supply pattern 40, ground pattern 50, and connection members 200 and arrangements of high-side transistors 110, low-side transistors 120, and capacitors 130.

<Output Pattern>

In the first modification of the third exemplary embodiment, output pattern 30 includes first output region 301 to third output region 303 corresponding to first switching section SWu to third switching section SWw, respectively, and further includes fourth output region 304 to sixth output region 306 corresponding to first switching section SWu to third switching section SWw, respectively. First output region 301 to third output region 303 are formed so as to extend in first direction X and spaced in first direction X. Likewise, fourth output region 304 to sixth output region 306 are formed so as to extend in first direction X and spaced in first direction X. Fourth output region 304 to sixth output region 306 are disposed so as to face, respectively, first output region 301 to third output region 303 with a distance therebetween in second direction Y, which is orthogonal to first direction X.

Both first output region 301 and fourth output region 304 are electrically connected to first output connection member 81; both second output region 302 and fifth output region 305 are electrically connected to second output connection member 82; and both third output region 303 and sixth output region 306 are electrically connected to third output connection member 83. FIG. 12 illustrates first output connection member 81 to third output connection member 83 with alternate long and two short dashes lines.

<Power Supply Pattern>

In the first modification of the third exemplary embodiment, power supply pattern 40 includes first power supply region 401, second power supply region 402, power supply interconnection region 410, first power supply connection region 431, second power supply connection region 432, and third power supply connection region 433.

<<Power Supply Region>>

First power supply region 401 and second power supply region 402 extend in an extending direction (first direction X) of first output region 301 to third output region 303. First power supply region 401 faces first output region 301 to third output region 303 with a predetermined distance therebetween in a direction (second direction Y) orthogonal to the extending direction of first output region 301 to third output region 303. Second power supply region 402 is disposed so as to face first power supply region 401 with first ground region 501, which will be described later, therebetween in the direction (second direction Y) orthogonal to the extending direction of first output region 301 to third output region 303.

<<Power Supply Interconnection Region>>

Power supply interconnection region 410 is formed so as to extend in the extending direction (first direction X) of first output region 301 to third output region 303 and disposed so as to face first power supply region 401 with first output region 301 to third output region 303 therebetween in the direction (second direction Y) orthogonal to the extending direction of first output region 301 to third output region 303. In this example, power supply interconnection region 410 is disposed near an edge part (lower edge part in FIG. 12) of substrate 20 in the lateral direction. In addition, power supply interconnection region 410 is electrically connected to the end (positive electrode) of DC power supply P.

<<Power Supply Connection Region>>

First power supply connection region 431 and second power supply connection region 432 are formed so as to extend in the direction (second direction Y) orthogonal to the extending direction of first output region 301 to third output region 303. First power supply connection region 431 is disposed between first output region 301 and second output region 302, whereas second power supply connection region 432 is disposed between second output region 302 and third output region 303. In addition, both first power supply connection region 431 and second power supply connection region 432 connect first power supply region 401 to power supply interconnection region 410.

Third power supply connection region 433 is formed so as to extend in second direction Y and connects first power supply region 401 to second power supply region 402. In this example, third power supply connection region 433 is disposed near an edge part (right edge part in FIG. 12) of substrate 20 in the longitudinal direction.

<Ground Pattern>

In the first modification of the third exemplary embodiment, ground pattern 50 includes first ground region 501, second ground region 502, ground interconnection region 510, first ground connection region 511, and second ground connection region 512.

<<Ground Region>>

First ground region 501 and second ground region 502 extend in an extending direction (first direction X) of fourth output region 304 to sixth output region 306. Second ground region 502 faces fourth output region 304 to sixth output region 306 with a predetermined distance therebetween in a direction (second direction Y) orthogonal to the extending direction of fourth output region 304 to sixth output region 306. First ground region 501 is disposed so as to face second ground region 502 with second power supply region 402 therebetween in the direction (second direction Y) orthogonal to the extending direction of fourth output region 304 to sixth output region 306.

<<Ground Interconnection Region>>

Ground interconnection region 510 is formed so as to extend in the extending direction (first direction X) of fourth output region 304 to sixth output region 306 and disposed so as to face second ground region 502 with fourth output region 304 to sixth output region 306 therebetween in the direction (second direction Y) orthogonal to the extending direction of fourth output region 304 to sixth output region 306. In this example, ground interconnection region 510 is disposed near an edge part (upper edge part in FIG. 12) of substrate 20 in the lateral direction. In addition, ground interconnection region 510 is electrically connected to the other end (negative electrode) of DC power supply P.

<<Ground Connection Region>>

First ground connection region 511 and second ground connection region 512 are formed so as to extend in the direction (second direction Y) orthogonal to the extending direction of fourth output region 304 to sixth output region 306. First ground connection region 511 is disposed between fourth output region 304 and fifth output region 305, whereas second ground connection region 512 is disposed between fifth output region 305 and sixth output region 306. Both first ground connection region 511 and second ground connection region 512 connect second ground region 502 to ground interconnection region 510.

<Arrangement of Power Supply Regions and Ground Regions>

The first modification of the third exemplary embodiment is similar to the third exemplary embodiment in that a plurality of power supply regions 400 and a plurality of ground regions 500 are disposed so as to face each other with a predetermined distance in a direction orthogonal to an extending direction of output regions 300.

More specifically, power supply interconnection region 410, first output region 301 to third output region 303, first power supply region 401, first ground region 501, second power supply region 402, second ground region 502, fourth output region 304 to sixth output region 306, and ground interconnection region 510 are arranged in this order from one end side to the other end side (the lower side to the upper side in the example of FIG. 12) in the lateral direction of substrate 20. In addition, first power supply region 401 faces first ground region 501 with a predetermined distance therebetween, whereas second power supply region 402 faces second ground region 502 with a predetermined distance therebetween.

<High-Side Switching Element and High-Side Transistor>

The first modification of the third exemplary embodiment is similar to the third exemplary embodiment in that conductive layer 22 of substrate 20 is provided with first high-side switching element 11u to third high-side switching element 11w. Each of first high-side switching element 11u to third high-side switching element 11w includes four high-side transistors 110.

The first modification of the third exemplary embodiment is similar to the third exemplary embodiment in that the four high-side transistors 110 that constitute first high-side switching element 11u are disposed spaced apart in first direction X, which is along the extending direction of first output region 301. These high-side transistors 110 are mounted on a surface of first power supply region 401 and connected to first output region 301. The four high-side transistors 110 that constitute second high-side switching element 11v are disposed spaced apart in first direction X, which is along the extending direction of second output region 302. These high-side transistors 110 are mounted on the surface of first power supply region 401 and connected to second output region 302. The four high-side transistors 110 that constitute third high-side switching element 11w are disposed spaced apart in first direction X, which is along the extending direction of third output region 303. These high-side transistors 110 are mounted on the surface of first power supply region 401 and connected to third output region 303.

<Low-Side Switching Element and Low-Side Transistor>

The first modification of the third exemplary embodiment is similar to the third exemplary embodiment in that conductive layer 22 of substrate 20 is provided with first low-side switching element 12u to third low-side switching element 12w. Each of first low-side switching element 12u to third low-side switching element 12w includes four low-side transistors 120.

In the first modification of the third exemplary embodiment, the four low-side transistors 120 that constitute first low-side switching element 12u are disposed spaced apart in first direction X, which is along an extending direction of fourth output region 304. These low-side transistors 120 are mounted on a surface of fourth output region 304 and connected to second ground region 502. The four low-side transistors 120 that constitute second low-side switching element 12v are disposed spaced apart in first direction X, which is along an extending direction of fifth output region 305. These low-side transistors 120 are mounted on a surface of fifth output region 305 and connected to second ground region 502. The four low-side transistors 120 that constitute third low-side switching element 12w are disposed spaced apart in first direction X, which is along the extending direction of sixth output region 306. These low-side transistors 120 are mounted on a surface of sixth output region 306 and connected to second ground region 502.

<Arrangement of High-Side Transistors and Low-Side Transistors>

In the first modification of the third exemplary embodiment, the plurality of high-side transistors 110 that constitute single high-side switching element 11 and the plurality of low-side transistors 120 that constitute single low-side switching element 12 are arranged in the direction (first direction X) along the extending direction of output regions 300 such that one high-side transistor 110 is disposed next to one corresponding low-side transistor 120 with capacitors 130, which will be described later, therebetween in the direction (second direction Y) orthogonal to the extending direction of output regions 300.

<Smoothing Capacitor Section and Capacitor>

The switching power supply device 10 according to the first modification of the third exemplary embodiment is similar to switching power supply device 10 according to the third exemplary embodiment, in that conductive layer 22 of substrate 20 is provided with smoothing capacitor section 13. Smoothing capacitor section 13 includes a plurality of capacitors 130.

The first modification of the third exemplary embodiment is similar to the third exemplary embodiment in that the plurality of capacitors 130 correspond to the plurality of high-side transistors 110 and the plurality of low-side transistors 120. Each of the plurality of capacitors 130 is disposed next to its corresponding transistor of the plurality of high-side transistors 110 and the plurality of low-side transistors 120. In other words, the plurality of high-side transistors 110, the plurality of low-side transistors 120, and the plurality of capacitors 130 are disposed such that pairs each including high-side transistor 110 and its corresponding capacitor 130 are positioned next to pairs each including low-side transistor 120 and its corresponding capacitor 130.

In this example, the plurality of capacitors 130 that correspond to the plurality of high-side transistors 110 constituting single high-side switching element 11 are arranged, one by one, next to the plurality of capacitors 130 that correspond to the plurality of low-side transistors 120 constituting single low-side switching element 12, in a direction (second direction Y) orthogonal to an array direction of the plurality of high-side transistors 110 (extending direction of output regions 300). More specifically, in this example, high-side transistors 110, capacitors 130 corresponding to high-side transistors 110, capacitors 130 corresponding to low-side transistors 120, and low-side transistors 120 are arranged in this order from one side to the other side (the lower side to the upper side in FIG. 12) of substrate 20 in the lateral direction.

<Connection Member>

The first modification of the third exemplary embodiment is similar to the third exemplary embodiment in that ground pattern 50 has first ground region 501 and second ground region 502 electrically connected via first ground connection member 55 and second ground connection member 56 (connection members 200). FIG. 12 illustrates first ground connection member 55 and second ground connection member 56 with alternate long and two short dashes lines. Both first ground connection member 55 and second ground connection member 56 electrically connect first ground region 501 to second ground region 502.

[Effect of First Modification of Third Exemplary Embodiment]

Switching power supply device 10 according to the first modification of the third exemplary embodiment can produce substantially the same effect as the effect of switching power supply device 10 according to the third exemplary embodiment. For example, it is possible to reduce heat concentration in high-side switching elements 11 and low-side switching elements 12.

(Second Modification of Third Exemplary Embodiment)

Figure 13:
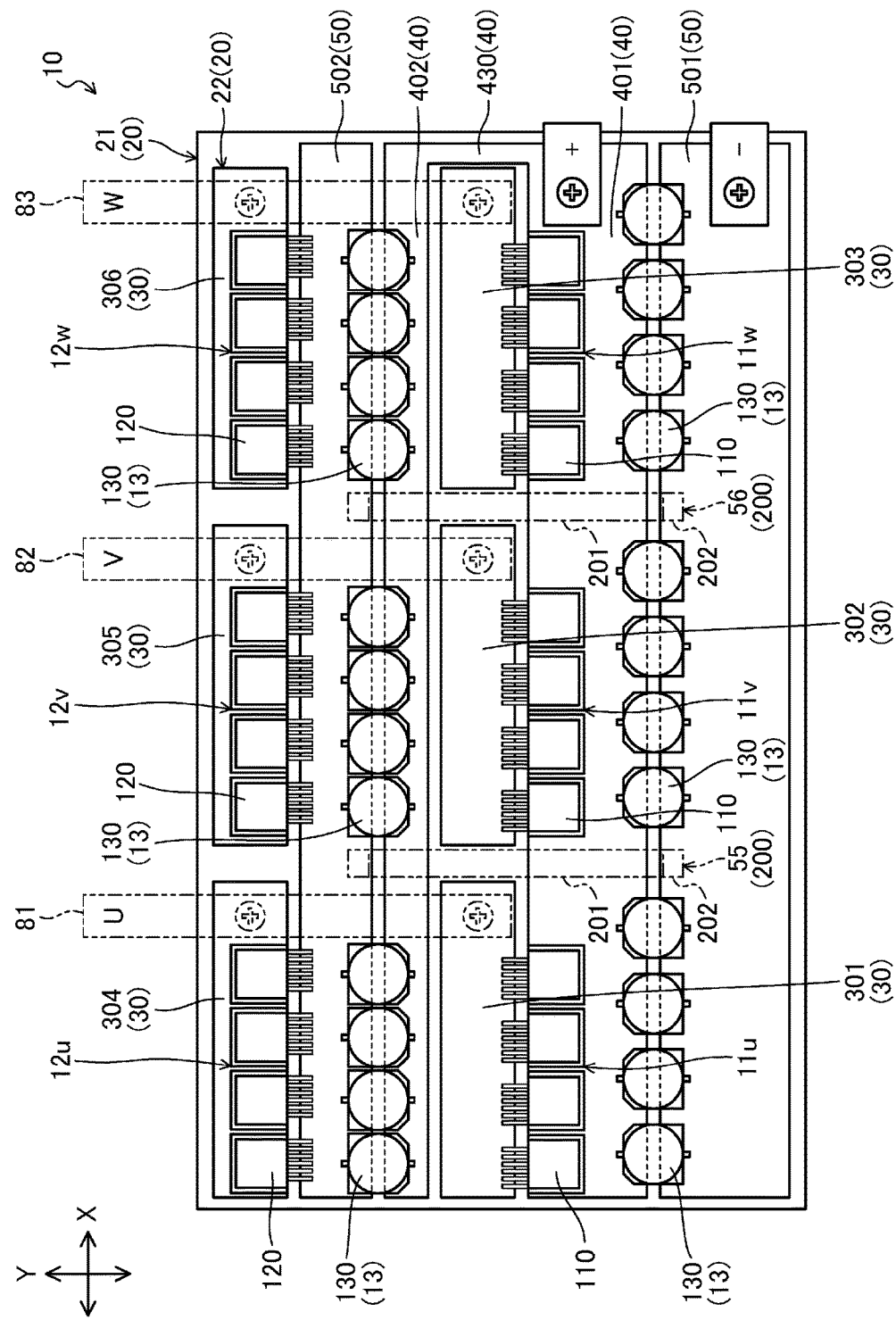
FIG. 13 is a plan view illustrating a configuration of a switching power supply device according to a second modification of the third exemplary embodiment.

FIG. 13 illustrates a configuration of switching power supply device 10 according to the second modification of the third exemplary embodiment. Switching power supply device 10 according to the second modification of the third exemplary embodiment differs from switching power supply device 10 according to the third exemplary embodiment, in configurations of output pattern 30, power supply pattern 40, ground pattern 50, and connection members 200 and arrangements of high-side transistors 110, low-side transistors 120, and capacitors 130.

<Output Pattern>

In the second modification of the third exemplary embodiment, output pattern 30 includes first output region 301 to third output region 303 respectively corresponding to first switching section SWu to third switching section SWw and further includes fourth output region 304 to sixth output region 306 respectively corresponding to first switching section SWu to third switching section SWw. First output region 301 to third output region 303 are formed so as to extend in first direction X and spaced in first direction X. Likewise, fourth output region 304 to sixth output region 306 are formed so as to extend in first direction X, and disposed spaced apart in first direction X. Fourth output region 304 to sixth output region 306 are disposed so as to face, respectively, first output region 301 to third output region 303 with a distance therebetween in second direction Y, which is orthogonal to first direction X.

Both first output region 301 and fourth output region 304 are electrically connected to first output connection member 81; both second output region 302 and fifth output region 305 are electrically connected to second output connection member 82; and both third output region 303 and sixth output region 306 are electrically connected to third output connection member 83. FIG. 13 illustrates first output connection member 81 to third output connection member 83 with alternate long and two short dashes lines.

<Power Supply Pattern>

In the second modification of the third exemplary embodiment, power supply pattern 40 includes first power supply region 401, second power supply region 402, and power supply connection region 430.

<<Power Supply Region>>

First power supply region 401 and second power supply region 402 extend in an extending direction of first output region 301 to third output region 303. First power supply region 401 faces first output region 301 to third output region 303 with a predetermined distance therebetween in a direction (second direction Y) orthogonal to the extending direction of first output region 301 to third output region 303. Second power supply region 402 is disposed so as to face first power supply region 401 with first output region 301 to third output region 303 therebetween in the direction (second direction Y) orthogonal to the extending direction of first output region 301 to third output region 303. In addition, first power supply region 401 is electrically connected to an end (positive electrode) of DC power supply P.

<<Power Supply Connection Region>>

Power supply connection region 430 is formed so as to extend in second direction Y and connects first power supply region 401 to second power supply region 402. In this example, power supply connection region 430 is disposed near an edge part (right edge part in FIG. 13) of substrate 20 in the longitudinal direction.

<Ground Pattern>

In the second modification of the third exemplary embodiment, ground pattern 50 includes first ground region 501 and second ground region 502.

<<Ground Region>>

First ground region 501 and second ground region 502 extend in an extending direction (first direction X) of fourth output region 304 to sixth output region 306. Second ground region 502 faces fourth output region 304 to sixth output region 306 with a predetermined distance therebetween in a direction (second direction Y) orthogonal to the extending direction of fourth output region 304 to sixth output region 306. First ground region 501 is disposed so as to face second ground region 502 with first power supply region 401, first output region 301 to third output region 303, and second power supply region 402 therebetween in the direction (second direction Y) orthogonal to the extending direction of fourth output region 304 to sixth output region 306.

<Arrangement of Power Supply Regions and Ground Regions>

The second modification of the third exemplary embodiment is similar to the third exemplary embodiment in that a plurality of power supply regions 400 and a plurality of ground regions 500 are disposed so as to face each other with a predetermined distance in a direction orthogonal to an extending direction of output regions 300.

More specifically, first ground region 501, first power supply region 401, first output region 301 to third output region 303, second power supply region 402, second ground region 502, and fourth output region 304 to sixth output region 306 are arranged in this order from one end side to the other end side (a lower side to an upper side in the example of FIG. 13) in the lateral direction of substrate 20. In addition, first power supply region 401 faces first ground region 501 with a predetermined distance therebetween, whereas second power supply region 402 faces second ground region 502 with a predetermined distance therebetween.

<High-Side Switching Element and High-Side Transistor>

The second modification of the third exemplary embodiment is similar to the third exemplary embodiment in that conductive layer 22 of substrate 20 is provided with first high-side switching element 11u to third high-side switching element 11w. Each of first high-side switching element 11u to third high-side switching element 11w includes four high-side transistors 110.

The second modification of the third exemplary embodiment is similar to the third exemplary embodiment in that the four high-side transistors 110 that constitute first high-side switching element 11u are disposed spaced apart in first direction X, which is along the extending direction of first output region 301. These high-side transistors 110 are mounted on a surface of first power supply region 401 and connected to first output region 301. The four high-side transistors 110 that constitute second high-side switching element 11v are disposed spaced apart in first direction X, which is along the extending direction of second output region 302. These high-side transistors 110 are mounted on the surface of first power supply region 401 and connected to second output region 302. The four high-side transistors 110 that constitute third high-side switching element 11w are disposed spaced apart in first direction X, which is along the extending direction of third output region 303. These high-side transistors 110 are mounted on the surface of first power supply region 401 and connected to third output region 303.

<Low-Side Switching Element and Low-Side Transistor>

The second modification of the third exemplary embodiment is similar to the third exemplary embodiment in that conductive layer 22 of substrate 20 is provided with first low-side switching element 12u to third low-side switching element 12w. Each of first low-side switching element 12u to third low-side switching element 12w includes four low-side transistors 120.

In the second modification of the third exemplary embodiment, the four low-side transistors 120 that constitute first low-side switching element 12u are disposed spaced apart in first direction X, which is along an extending direction of fourth output region 304. These low-side transistors 120 are mounted on a surface of fourth output region 304 and connected to second ground region 502. The four low-side transistors 120 that constitute second low-side switching element 12v are disposed spaced apart in first direction X, which is along an extending direction of fifth output region 305. These low-side transistors 120 are mounted on a surface of fifth output region 305 and connected to second ground region 502. The four low-side transistors 120 that constitute third low-side switching element 12w are disposed spaced apart in first direction X, which is along the extending direction of sixth output region 306. These low-side transistors 120 are mounted on a surface of sixth output region 306 and connected to second ground region 502.

<Arrangement of High-Side Transistors and Low-Side Transistors>

In the second modification of the third exemplary embodiment, the plurality of high-side transistors 110 that constitute single high-side switching element 11 and the plurality of low-side transistors 120 that constitute single low-side switching element 12 are arranged in the direction (first direction X) along the extending direction of output regions 300 such that one high-side transistor 110 is disposed next to corresponding one low-side transistor 120 with capacitors 130, which will be described later, therebetween in the direction (second direction Y) orthogonal to the extending direction of output regions 300.

<Smoothing Capacitor Section and Capacitor>

The switching power supply device 10 according to the second modification of the third exemplary embodiment is similar to switching power supply device 10 according to the third exemplary embodiment, in that conductive layer 22 of substrate 20 is provided with smoothing capacitor section 13. Smoothing capacitor section 13 includes a plurality of capacitors 130.

The second modification of the third exemplary embodiment is similar to the third exemplary embodiment in that the plurality of capacitors 130 correspond to the plurality of high-side transistors 110 and the plurality of low-side transistors 120. Each of the plurality of capacitors 130 is disposed next to its corresponding transistor of the plurality of high-side transistors 110 and the plurality of low-side transistors 120. In other words, the plurality of high-side transistors 110, the plurality of low-side transistors 120, and the plurality of capacitors 130 are disposed such that pairs each including high-side transistor 110 and its corresponding capacitor 130 are positioned next to pairs each including low-side transistor 120 and its corresponding capacitor 130.

In this example, the plurality of capacitors 130 that correspond to the plurality of high-side transistors 110 constituting single high-side switching element 11 are disposed, one by one, next to the plurality of low-side transistors 120 constituting single low-side switching element 12, in a direction (second direction Y) orthogonal to an array direction of the plurality of high-side transistors 110 (extending direction of output regions 300). More specifically, in this example, capacitors 130 corresponding to high-side transistors 110, high-side transistors 110, capacitors 130 corresponding to low-side transistors 120, and low-side transistors 120 are arranged in this order from one side to the other side (from the lower side to the upper side in FIG. 13) of substrate 20 in the lateral direction.

<Connection Member>

The second modification of the third exemplary embodiment is similar to the third exemplary embodiment in that ground pattern 50 has first ground region 501 and second ground region 502 electrically connected via first ground connection member 55 and second ground connection member 56 (connection members 200). FIG. 13 illustrates first ground connection member 55 and second ground connection member 56 with alternate long and two short dashes lines. Both first ground connection member 55 and second ground connection member 56 electrically connect first ground region 501 to second ground region 502.

[Effect of Second Modification of Third Exemplary Embodiment]

Switching power supply device 10 according to the second modification of the third exemplary embodiment can produce substantially the same effect as the effect of switching power supply device 10 according to the third exemplary embodiment. For example, it is possible to reduce heat concentration in high-side switching elements 11 and low-side switching elements 12.

(Third Modification of Third Exemplary Embodiment)

Figure 14:
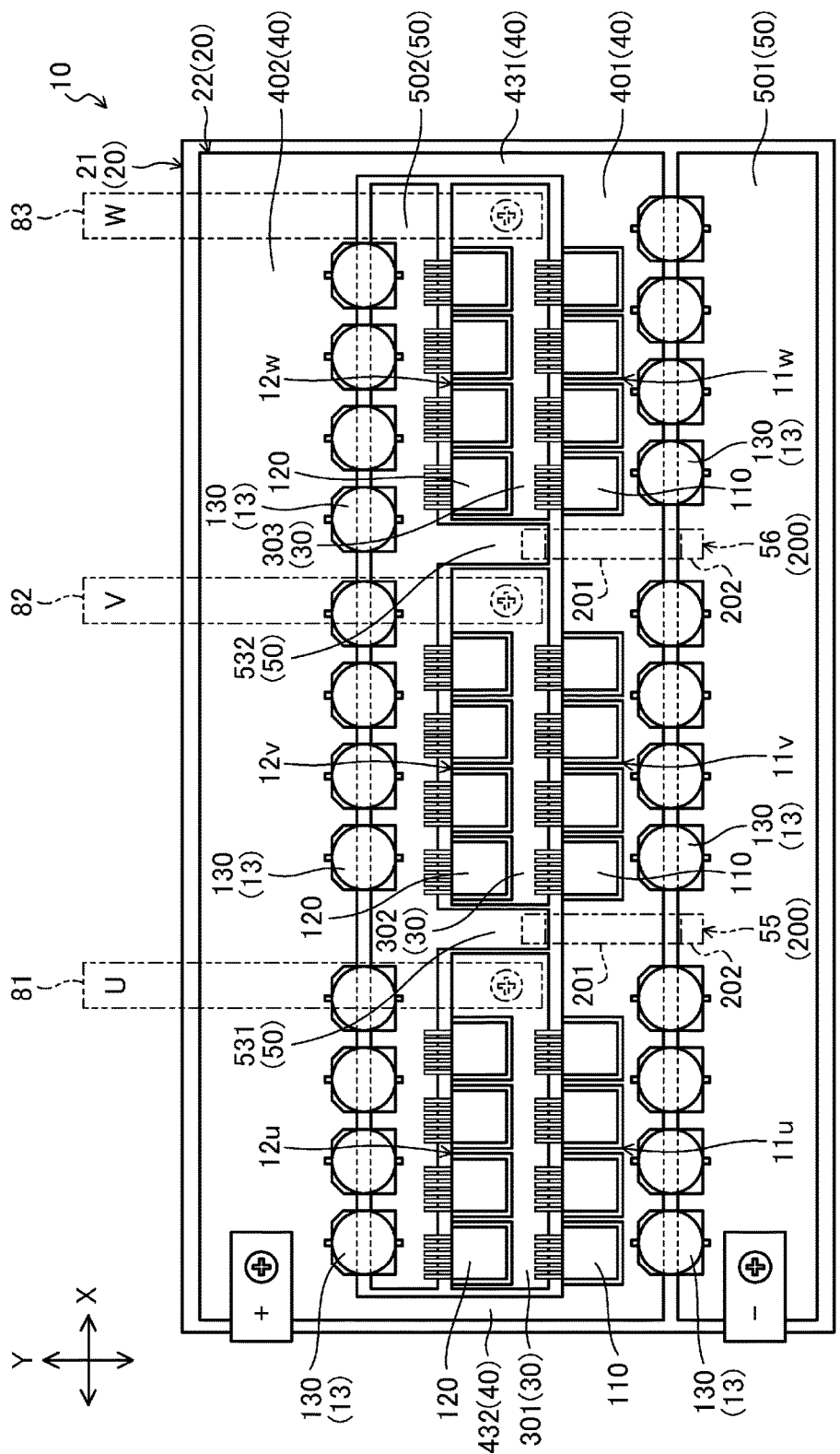
FIG. 14 is a plan view illustrating a configuration of a switching power supply device according to a third modification of the third exemplary embodiment.

FIG. 14 illustrates a configuration of switching power supply device 10 according to the third modification of the third exemplary embodiment. Switching power supply device 10 according to the third modification of the third exemplary embodiment differs from switching power supply device 10 according to the third exemplary embodiment, in a configuration of power supply pattern 40.

<Power Supply Pattern>

In the third modification of the third exemplary embodiment, power supply pattern 40 includes first power supply connection region 431 and second power supply connection region 432, instead of power supply connection region 430 illustrated in FIG. 11.

<<Power Supply Connection Region>>

Both first power supply connection region 431 and second power supply connection region 432 are formed so as to extend in second direction Y and connects first power supply region 401 to second power supply region 402. In this example, first power supply connection region 431 is disposed near an edge part (right edge part in FIG. 14) of substrate 20 in the longitudinal direction, whereas second power supply connection region 432 is disposed near the other edge part (left edge part in FIG. 14) of substrate 20 in the longitudinal direction. In this example, first power supply region 401, second power supply region 402, first power supply connection region 431, and second power supply connection region 432 are connected to form a continuous annular path. In short, in this example, power supply pattern 40 has a continuous annular path.

[Effect of Third Modification of Third Exemplary Embodiment]

Switching power supply device 10 according to the third modification of the third exemplary embodiment can produce substantially the same effect as the effect of switching power supply device 10 according to the third exemplary embodiment. For example, it is possible to reduce heat concentration in high-side switching elements 11 and low-side switching elements 12.

In switching power supply device 10 according to the third modification of the third exemplary embodiment, power supply pattern 40 has the continuous annular path.

This configuration can improve the degree of freedom of selecting a current path (shortest current path) between components (for example, high-side transistors 110 and capacitors 130) provided in power supply pattern 40. Consequently, it is possible to shorten the current paths between the components, thereby reducing parasitic inductances of the current paths between these components. Therefore, it is possible to reduce surge voltages (for example, surge voltages caused by switching operations of the switching elements) applied to the components constituting switching power supply device 10.

In switching power supply device 10 according to the third modification of the third exemplary embodiment, ground pattern 50 may also have a continuous annular path. In short, at least one of power supply pattern 40 and ground pattern 50 may have a continuous annular path.

Other Exemplary Embodiments

The above description has been given regarding a case where each connection member 200 is formed of a bus bar (conductor having a planar shape); however, a structure of each connection member 200 is not limited to this example. As an alternative example, each connection member 200 may be formed of a metallic, conductive wire.

The above description has been given regarding an exemplary case where materials of connection members 200 and heat dissipation layer 23 are of the same type; however, materials of connection members 200 and heat dissipation layer 23 may be of different types.

The above description has been given regarding a case where the number of capacitors 130 constituting smoothing capacitor section 13 is equal to the total number of high-side transistors 110 and low-side transistors 120 mounted on substrate 20; however, the number of capacitors 130 is not limited to this example. As an alternative example, the number of capacitors 130 constituting smoothing capacitor section 13 is different from the total number of high-side transistors 110 and low-side transistors 120 mounted on substrate 20.

Two or more of the exemplary embodiments and the modifications described above may be combined together as appropriate and performed. The exemplary embodiments and the modifications described above are merely intrinsically preferred examples and are not intended to narrow scopes of the disclosure and ranges of its application and usage.

INDUSTRIAL APPLICABILITY

As described above, the present disclosure is applicable to switching power supply devices.

The invention claimed is:

1. A switching power supply device including a high-side switching element and a low-side switching element, the low-side switching element being connected in series to the high-side switching element, the switching power supply device comprising:
a substrate having an insulating layer and a conductive layer, the conductive layer being on one surface of the insulating layer;
a plurality of high-side transistors on the conductive layer, the high-side transistors being connected in parallel to constitute the high-side switching element;
a plurality of low-side transistors on the conductive layer, the low-side transistors being connected in parallel to constitute the low-side switching element; and
a smoothing capacitor section on the conductive layer,
wherein the plurality of high-side transistors is arranged, one by one, next to the plurality of low-side transistors in a first direction,
the smoothing capacitor section includes a plurality of capacitors on the conductive layer, the plurality of capacitors corresponding to the plurality of high-side transistors and the plurality of low-side transistors,
each of the plurality of capacitors is disposed next to a corresponding transistor in a second direction orthogonal to the first direction, the corresponding transistor being one of the plurality of high-side transistors and the plurality of low-side transistors.

2. The switching power supply device according to claim 1, wherein
an output pattern, a power supply pattern, and a ground pattern are in the conductive layer,
the plurality of high-side transistors is electrically connected to the output pattern and to the power supply pattern,
the plurality of low-side transistors is electrically connected to the output pattern and to the ground pattern, and
at least one of the power supply pattern or the ground pattern has a continuous annular path.

3. A switching power supply device including a high-side switching element and a low-side switching element, the low-side switching element being connected in series to the high-side switching element, the switching power supply device comprising:
a substrate having an insulating layer and a conductive layer, the conductive layer being on one surface of the insulating layer;
a plurality of high-side transistors on the conductive layer, the high-side transistors being connected in parallel to constitute the high-side switching element;
a plurality of low-side transistors on the conductive layer, the low-side transistors being connected in parallel to constitute the low-side switching element; and
a smoothing capacitor section on the conductive layer,
wherein the plurality of high-side transistors is arranged, one by one, next to the plurality of low-side transistors,
the smoothing capacitor section includes a plurality of capacitors on the conductive layer, the plurality of capacitors corresponding to the plurality of high-side transistors and the plurality of low-side transistors,
each of the plurality of capacitors is disposed next to a corresponding transistor, the corresponding transistor being one of the plurality of high-side transistors and the plurality of low-side transistors, and
the plurality of high-side transistors, the plurality of low-side transistors, and the plurality of capacitors are disposed such that a pair including one of the plurality of high-side transistors and a corresponding one of the plurality of capacitors is respectively positioned next to a pair including one of the plurality of low-side transistors and the corresponding one of the plurality of capacitors.

4. The switching power supply device according to claim 3, wherein
an output pattern, a power supply pattern, and a ground pattern are in the conductive layer,
the plurality of high-side transistors is electrically connected to the output pattern and to the power supply pattern, the plurality of low-side transistors is electrically connected to the output pattern and to the ground pattern, and at least one of the power supply pattern or the ground pattern has a continuous annular path.

5. A switching power supply device including a high-side switching element and a low-side switching element, the low-side switching element being connected in series to the high-side switching element, the switching power supply device comprising:

a substrate having an insulating layer and a conductive layer, the conductive layer being on one surface of the insulating layer;

a plurality of high-side transistors on the conductive layer, the high-side transistors being connected in parallel to constitute the high-side switching element; and a plurality of low-side transistors on the conductive layer, the low-side transistors being connected in parallel to constitute the low-side switching element;

wherein the plurality of high-side transistors is arranged, one by one, next to the plurality of low-side transistors, an output pattern, a power supply pattern, and a ground pattern are in the conductive layer, the plurality of high-side transistors is electrically connected to the output pattern and to the power supply pattern, the plurality of low-side transistors is electrically connected to the output pattern and to the ground pattern, at least one of the power supply pattern and the ground pattern has a plurality of wiring regions electrically connected via a connection member, the connection member comprises a conductor having a planar shape, the substrate includes the insulating layer, the conductive layer, and a heat dissipation layer on another surface of the insulating layer, the connection member has a main body that is in a planar shape and that faces the conductive layer with a distance between the main body and the conductive layer, and an extending part extending from the main body to any one of the plurality of wiring regions, the substrate is provided with a first through-hole, a second through-hole, and a third through-hole, the first through-hole penetrating the insulating layer, the second through-hole penetrating any one of the plurality of wiring regions to communicate with the first through-hole, the third through-hole penetrating the heat dissipation layer to communicate with the first through-hole, the extending part of the connection member is bonded, with soldering, to one of the plurality of wiring regions that is provided with the second through-hole while being inserted into the first through-hole, the second through-hole, and the third through-hole, and the third through-hole has a larger opening area than an opening area of the first through-hole to prevent the extending part of the connection member inserted into the first through-hole, the second through-hole, and the third through-hole from making contact with an inner wall of the third through-hole.

6. The switching power supply device according to claim 5, wherein a material of the connection member is identical in type to a material of the heat dissipation layer.

7. The switching power supply device according to claim 5, wherein portions of the connection member are subjected to plate processing for solder bonding.

8. The switching power supply device according to claim 5, further comprising:

a nut bonded to any one of the plurality of wiring regions with soldering; and a bolt that penetrates the connection member and that is fixed to the nut.

9. The switching power supply device according to claim 5, wherein at least one of the power supply pattern or the ground pattern has a continuous annular path.

* * * * *